(12) United States Patent  
Igarashi

(10) Patent No.: US 8,188,555 B2  
(45) Date of Patent: May 29, 2012

(54) CAPACITIVE SENSOR AND MANUFACTURING METHOD THEREFOR

(75) Inventor: Yasushi Igarashi, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/277,329

(22) Filed: Nov. 25, 2008

(65) Prior Publication Data

US 2009/0146227 A1  Jun. 11, 2009

(30) Foreign Application Priority Data

Dec. 6, 2007 (JP) ................... 2007-315328

(51) Int. Cl.
   *H01L 29/84* (2006.01)
(52) U.S. Cl. .............. 257/415; 257/E29.324; 438/50
(58) Field of Classification Search .......... 257/415, 257/E29.324, E21.613; 438/50, 52
   See application file for complete search history.

(56) References Cited

U.S. PATENT DOCUMENTS

| | | | |
|---|---|---|---|
| 7,528,529 B2 * | 5/2009 | Yamaguchi et al. ......... 310/344 |
| 2004/0241545 A1 * | 12/2004 | Ochiai et al. ................. 429/223 |
| 2006/0205106 A1 * | 9/2006 | Fukuda et al. ................. 438/52 |
| 2007/0296008 A1 * | 12/2007 | Natori ........................... 257/295 |
| 2007/0298534 A1 * | 12/2007 | Ikushima et al. ............... 438/57 |
| 2008/0196502 A1 * | 8/2008 | Fukuda et al. .............. 73/514.38 |

FOREIGN PATENT DOCUMENTS

| JP | 2003057263 A | | 2/2003 |
|---|---|---|---|
| JP | 2005-123561 | * | 5/2005 |
| JP | 2005123561 A | | 5/2005 |

OTHER PUBLICATIONS

T. Fujimoto et al., "Above-IC Integration of Capacitive Pressure Sensor Fabricated With CMOS Interconnect Processes", Japan, Hitachi Ltd. Central Research Laboratory, Jan. 21, 2007.

"Analog Devices, Inc., Integrates Gyro on One Chip Using MEMS Technology" shown on a page of a web site "MYCOM Journal", Oct. 2, 2002.

* cited by examiner

*Primary Examiner* — Tony Tran
(74) *Attorney, Agent, or Firm* — Volentine & Whitt, PLLC

(57) ABSTRACT

A capacitive sensor includes a semiconductor substrate, a fixed electrode serving as a first electrode formed on a surface of or in the semiconductor substrate, a structure formed on the semiconductor substrate to have a vibratable second electrode that is formed to be spaced from and opposed to the semiconductor substrate and from the fixed electrode serving as the first electrode, a sealing member serving as a first sealing member formed on the semiconductor substrate to be spaced from the structure, to cover the structure, and to have a through hole serving as a first through hole, and a movable electrode serving as a vibratable third electrode formed on the sealing member to block up the through hole, and to be spaced from and opposed to the movable electrode.

15 Claims, 13 Drawing Sheets

CAPACITIVE SENSOR AND MANUFACTURING METHOD THEREFOR

CROSS-REFERENCE TO RELATED APPLICATION

This application claims priority under 35 USC 119 from Japanese Patent Application No. 2007-315328, the disclosure of which is incorporated by reference therein.

BACKGROUND OF THE INVENTION

1. Field of the Invention

The present invention relates to a capacitive sensor, such as an acceleration sensor, based on micro-electro-mechanical systems (MEMS) and to a manufacturing method therefor. More particularly, the invention relates to a technique for implementing two types of sensors in one MEMS device.

2. Description of Related Art

Generally, in a case where a certain type sensing function is added to a sensor product, it is necessary to add a MEMS sensor having a desired function to the sensor product. However, the addition of a physical structure, such as the MEMS sensor, thereto results in increase in the area and volume of a semiconductor chip.

Further, in a case where the size of a semiconductor chip is predetermined, a certain function should be sacrificed due to limitations to the area and volume of the semiconductor chip. Consequently, a problem occurs in that the semiconductor chip requires an additional area in order to manufacture a product having a desired function.

Thus, hitherto, various techniques have been proposed to suppress the area and volume of a semiconductor chip from being increased due to the addition of a function to a sensor product.

For example, a device disclosed in JP-A No. 2005-123561 implements the reduction in the size of a sensor based on a MEMS device, which is disclosed in JP-A No. 2003-57263, by replacing a glass package with a package made of silicon oxide. More specifically, the device disclosed in JP-A No. 2005-123561 has the following structure.

That is, JP-A No. 2005-123561 discloses a sealing structure of a MEMS device in FIG. 1, in which a MEMS 2 serving as a movable structure is sealed in a space between a substrate 1 and a sealing member 3 formed on the substrate 1 so as to cover the MEMS 2. In this sealing structure, the sealing member 3 has a first sealing sub-member 4, which is positioned at the side of the space and has through holes 4a, and a second sealing sub-member 5 which is positioned on the outer side of the first sealing sub-member 4 and blocks up the through holes 4a.

Incidentally, JP-A No. 2003-57263 discloses an acceleration sensor having a movable structure that includes electrodes sealed by a glass package. Further, a pressure sensor based on MEMS is disclosed in the following article:

T. Fujimoto, Y Hanaoka, and H. Fukuda: "ABOVE-IC INTEGRATION OF CAPACITIVE PRESSURE SENSOR FABRICATED WITH CMOS INTERCONNECT PROCESSES", JAPAN, Hitachi Ltd. Central Research Laboratory, Jan. 21, 2007.

The pressure sensor disclosed in this article implements the reduction of the chip area thereof by forming a circuit element at a lower portion thereof Furthermore, a structure, in which a circuit element and an acceleration sensor are mounted on one chip, is disclosed by an article "Analog Devices, Inc., Integrates Gyro on One chip Using MEMS Technology" shown on a page of a web site "MYCOMI JOURNAL", which has a URL that is http://journal.mycom.co.jp/news/2002/10/02/05.html, on the Internet. The chip area can be reduced by this structure.

However, according to the structure disclosed in JP-A No. 2005-123561, only one type of a sensor can be implemented due to the limitations to the area and volume of one semiconductor chip, which are employed for fabricating one sensor. That is, two or more types of sensors cannot be implemented by such a structure. Accordingly, in a case where two or more types of sensors are implemented, one semiconductor chip requires commensurate area and volume.

SUMMARY OF THE INVENTION

The present invention is accomplished to solve the foregoing problem. A structure and a manufacturing method according to the invention have the following features.

According to the invention, there is provided a sensor including:

a semiconductor substrate;

a first electrode formed on a surface of or within the semiconductor substrate;

a structure formed on the semiconductor substrate, the structure including a vibratable second electrode that is formed spaced from and opposed to the semiconductor substrate and the first electrode;

a first sealing member formed on the semiconductor substrate spaced from the structure and covering the structure, and in which a first through hole is formed; and a vibratable third electrode formed on the first sealing member blocking the first through hole, and spaced from and opposed to the vibratable second electrode.

Further, according to the invention, there is provided a sensor manufacturing method, including:

preparing a semiconductor substrate having a first electrode;

forming a first deposition film deposited on the semiconductor substrate;

coating the first deposition film with a first insulating film;

forming a second electrode on the first insulating film;

forming a first opening portion configured to expose a part of the first deposition film by penetrating the second electrode and the first insulating film or only penetrating the first insulating film;

coating the second electrode and the first insulating film with a second deposition film;

coating the second deposition film with a second insulating film;

forming a second opening portion that exposes a part of the second deposition film by penetrating the second insulating film;

removing the first deposition film and the second deposition film through the first opening portion and the second opening portion; and forming a third electrode that blocks the second opening portion.

The structure of a sensor according to the invention includes a third electrode. Thus, the capacitance between the first electrode and the second electrode and that between the second electrode and the third electrode can be measured simultaneously. Consequently, two types of sensors can simultaneously be implemented by the area and volume of one semiconductor chip, which are employed for fabricating one type of a sensor. In addition, the manufacturing method therefor according to the invention can implement the structure of a sensor according to the invention.

BRIEF DESCRIPTION OF THE DRAWINGS

Preferred exemplary embodiments of the present invention will be described in detail based on the following figures, wherein.

DESCRIPTION OF THE INVENTION

Hereinafter, embodiments of a structure of a sensor according to the present invention and a manufacturing method therefor according to the present invention are described with reference to FIGS. 1A to 10.

Figure 1A:
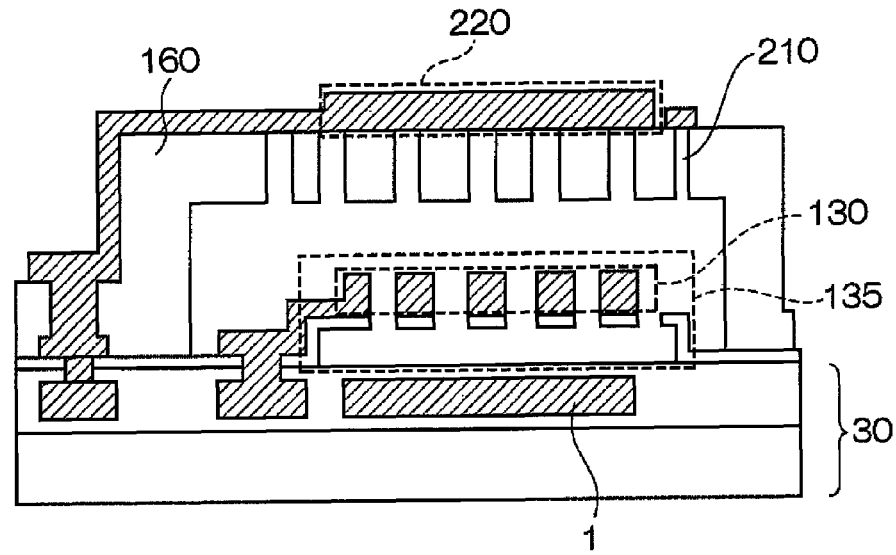
FIG. 1A is a cross-sectional view illustrating a common structure of sensors according to the invention.
Figure 1B:
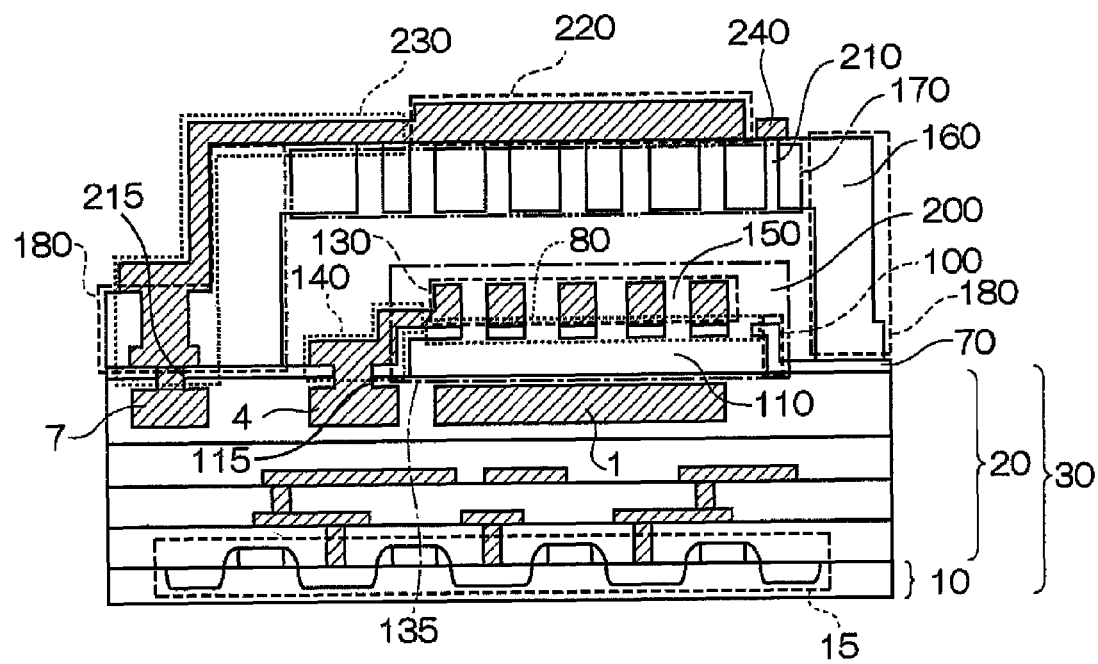
FIG. 1B is a cross-sectional view illustrating a common structure of sensors according to the invention.
Figure 2A:
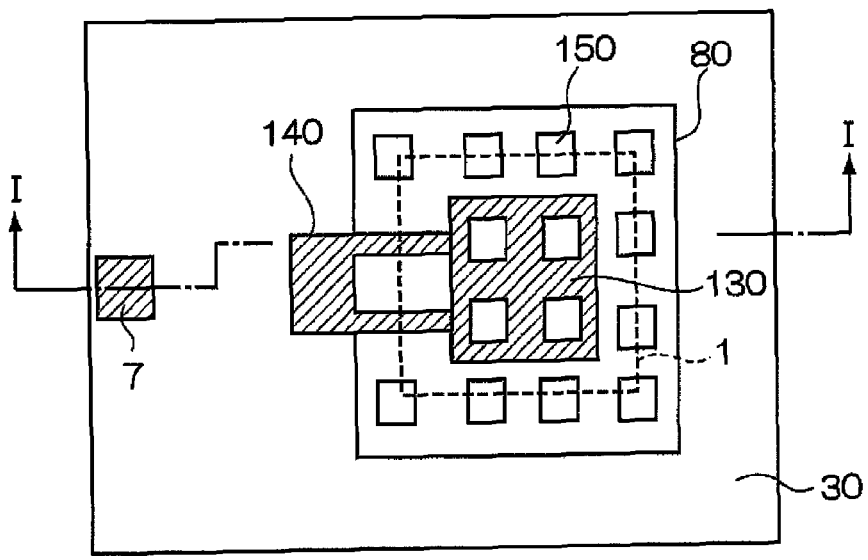
FIG. 2A is a cross-sectional view illustrating a common structure of sensors according to the invention.
Figure 2B:
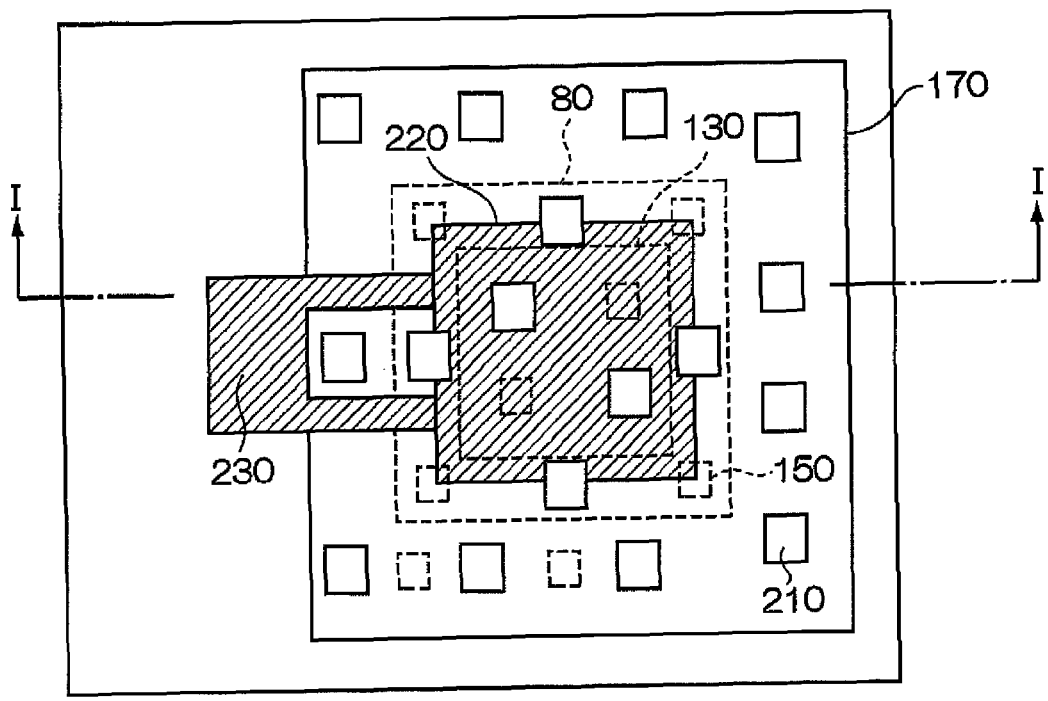
FIG. 2B is a cross-sectional view illustrating a common structure of sensors according to the invention.

First, a common structure of sensors according to the invention is described below with reference to FIGS. 1A, 1B, 2A, and 2B. FIGS. 1A and 1B are cross-sectional views of the common structure of the sensors according to the invention. FIGS. 2A and 2B are plan views of the common structure the sensors according to the invention, which are taken from a direction perpendicular to a surface of the semiconductor substrate 30. Incidentally, a line I-I shown in FIGS. 2A and 2B designates a section of the cross-sectional views of FIGS. 1A to 2B in the common structure of the sensor according to the invention. In the following description, the expression "planarly viewing" designates "viewing from a direction perpendicular to a surface of the semiconductor substrate 30".

Each of the sensors according to the invention is mounted on a printed circuit board by techniques such as wire-bonding.

As illustrated in FIG. 1A, the common structure of the sensors according to the invention includes the semiconductor substrate 30, a fixed electrode 1 serving as a first electrode formed on a surface of or in the semiconductor substrate 30, a structure 135 formed above the semiconductor substrate 30 to have a vibratable second electrode that is formed to be spaced from and opposed to the semiconductor substrate 30 and from the fixed electrode 1 serving as the first electrode, a sealing member 160 serving as a first sealing member formed on the semiconductor substrate 30 to be spaced from the structure 135, to cover the structure 135, and to have a through hole 210 serving as a first through hole, and a movable electrode 220 serving as a vibratable third electrode formed on the sealing member 160 to block up the through hole 210, and to be spaced from and opposed to the movable electrode 130.

As illustrated in FIG. 1B, the semiconductor substrate 30 includes a circuit element substrate 10 on which a circuit element 15 is formed, and a metal wiring layer 20 in which multilayered wiring layers are formed. The circuit element 15 is a general circuit element including a transistor, which is formed on a surface of or in the circuit element substrate 10, and functions as means for processing electrical signals input to and output from the sensor. The circuit substrate 10 is a silicon substrate having a circuit element 15 for processing electrical signals output from the sensor. The metal wiring layer 20 is a general wiring multilayer that is formed on and above the circuit element 15 to be surrounded by an interlayer insulating film and that functions as means for connecting an electrical signal, which is output from the sensor, and an electrical signal, which is output from the circuit element, to each other. Incidentally, a wiring pattern 4, the fixed electrode 1 serving as the first electrode is formed in an uppermost metal wiring layer in addition to ordinary wiring patterns including a wiring pattern 4 and a wiring pattern 7.

The fixed electrode 1 is formed in the uppermost metal wiring layer that is inside the semiconductor substrate 30. The fixed electrode 1 is electrically capacitively-coupled to the movable electrode 130 formed to be opposed thereto. The film thickness of the fixed electrode 1 is 0.5 μm. The fixed electrode 1 is shaped as a square, with sides having a length of 100 μm, as seen in plan view and is made of aluminum. It should be noted that the fixed electrode 1 may be provided on the surface of the semiconductor substrate 30. In any case, the fixed electrode 1 is electrically connected to the metal wiring layer 20.

The structure 135 covers apart of the surface of the semiconductor substrate 30 to be spaced therefrom. In addition, the movable electrode 130 is formed above the part of the surface of the semiconductor substrate 30. Further, the structure 135 includes the movable electrode 130 serving as the vibratable second electrode formed to be spaced from and opposed to the semiconductor substrate 30 and the fixed electrode 1, a movable plate 80, and a fixed portion 100. The movable plate 80 and the fixed portion 100 are made of silicon oxide film and are continuously formed to be integral with each other. The movable plate 80 is shaped like a square, whose side has a length of 110 μm, in plan view and is formed above the semiconductor substrate 30 to be spaced by 0.5 μm from the surface of the semiconductor substrate 30 and opposed thereto. Further, as illustrated in FIG. 2A, the movable plate 80 and the fixed portion 100 are formed to cover the fixed electrode 1 in plan view. In FIG. 2A, the fixed electrode 1 is represented by dotted lines, because the fixed electrode 1 is invisible from the outside. The fixed portion 100 is formed so as to connect the movable plate 80 to the semiconductor substrate 30 in a direction perpendicular to the surface of the semiconductor substrate 30 and as to cover a part of the surface of the semiconductor substrate 30 together with the movable plate 80. Incidentally, a hollow space housed by the structure 135 and the semiconductor substrate 30 is referred to as a hollow portion 110.

The movable electrode 130 is formed on the movable plate 80 to be opposed to the fixed electrode 1. The film thickness of the movable electrode 130 is 3 μm. The movable electrode 130 is shaped as a square, with sides having a length of 30 μm, as seen in plan view. Further, the movable electrode 130 is electrically connected to the wiring pattern 4 via a through hole 115 and a wiring pattern 140. The through hole 115 is formed by exposing the wiring pattern 4 on the surface of the semiconductor substrate 30. Further, the wiring pattern 140 is connected to an end portion of the movable electrode 130 at one end thereof. The wiring pattern 140 extends over the movable plate 80 and the fixed portion 100, and is connected to the wiring pattern 4 at the other end thereof via the through hole 115. The movable electrode 130 overlaps the fixed electrode 1 as seen in plan view. Preferably, as illustrated in FIG. 2A, the movable electrode 130 is formed within the fixed electrode 1. Further, preferably, in a case where the intersection point of the diagonal lines of each of the movable electrode 130 and the movable plate 80 is set as a central portion, the central portions of the movable electrode 130 and the movable plate 80 overlap with each other as seen in plan view. More preferably, the central portions of the movable electrode 130 and the movable plate 80 coincide with each other as seen in plan view.

Incidentally, the structure 135 includes a through hole 150 that penetrates through the movable electrode 130 and the movable plate 80. The through hole 150 is shaped like a square, whose one side is 1 μm, in plan view.

The sealing member 160 is formed on the semiconductor substrate 30 such that the sealing member 160 is spaced from the structure 135 and covers the structure 135 and includes a through hole 210. The sealing member 160 includes a movable portion 170 and a fixed portion 180. The sealing member 160 is formed of a silicon oxide film, the thickness of which is 2 μm. The sealing member 160 can be formed, using a silicon oxide film, such that the film thickness thereof is equal to or less than 10 μm. Consequently, as compared with a conventional device of forming a sealing member by a sealing method using a glass or ceramic package to have a film thickness of about 0.1 mm or larger as a finishing thickness, the volume and weight of a semiconductor chip for forming a sensor can considerably be reduced. Incidentally, even the sealing member 160 formed of a silicon nitride film can have similar advantages. The movable portion 170 is shaped like a square, whose one side has a length of 160 μm, and is formed to be spaced from and opposed to the movable electrode 130 and the movable plate 80. This is because each of the movable electrode 130 and the movable plate 80 cannot perform a desired operation in a case where the sealing member 160 is closely attached thereto. Further, as illustrated in FIG. 2B, the movable portion 170 is formed to cover the existence region of the structure 135, i.e., the movable plate 80 in plan view. The fixed portion 180 connects the movable plate 170 to the semiconductor substrate 30 in a direction perpendicular to the surface of the semiconductor substrate 30 and is formed to cover the structure 135 together with the movable plate 170. At that time, the joining portion between the fixed portion 180 and the semiconductor substrate 30 is spaced from and surrounds the structure 135 in plan view.

As illustrated in FIG. 2B, plural through holes 210 are formed above the movable plate 170. The plural through holes 210 are formed at positions in plan view, at which the through holes 210 do not overlap with one another. Incidentally, because the through holes 150 cannot be viewed from the outside, the through holes 150 are represented by doted lines.

The movable electrode 220 is formed on the sealing member 160 to block up the through holes 210 and to be spaced from and opposed to the movable electrode 130. The thickness of the movable electrode 22 is 1 μm. The movable electrode 220 is shaped like a square, whose one side has a length of 100 μm, in plan view. Preferably, the movable electrode 220 is made of a material whose main ingredient is aluminum. It is best that the movable electrode 220 is made of aluminum. Aluminum can absorb minute amounts of gas and moisture discharged from the silicon oxide film used in the semiconductor substrate 30 and the first sealing member. Thus, the rate of increase in the air pressure of each of the hollow portions 110 and 200, which is caused by time degradation, can be mitigated. The movable electrode 220 is electrically connected to the wiring pattern 7 via a through hole 215 and a wiring pattern 230. The through hole 215 is formed by exposing the wiring pattern 7 on the surface of the semiconductor substrate 30. The wiring pattern 230 is connected to one end portion of the movable electrode 220 at one end thereof. The wiring pattern 230 extends over the movable portion 170 and the fixed portion 180 and is connected to the wiring pattern 7 via the through hole 215 at the other end thereof. Further, as illustrated in FIG. 2B, the movable electrode 220 is formed to overlap with the movable electrode 130 in plan view. It is preferable to form the movable electrode 220 so as to cover the movable electrode 130.

Further, in a case where the intersection point of the diagonal lines of each of the movable electrode 220 and the movable plate 170 is set as a central portion, it is preferable that the central portions of the movable electrode 220 and the movable plate 170 overlap, in plan view, with each other. More preferably, the central portions of the movable electrode 220 and the movable plate 170 coincide, in plan view, with each other.

Incidentally, the through hole 210, which is not blocked up by the movable electrode 220, is blocked up by a sealing pattern 240 whose one side is longer than that of the through hole 210.

The aforementioned structure is the common structure of sensors according to the invention. Additionally, the structure 135 is air-tightly sealed by the sealing member 160, the movable electrode 220, the sealing member 240, and the semiconductor substrate 30. At that time, a hollow space, which is air-tightly sealed by the sealing member 160, the movable electrode 220, the sealing member 240, and the semiconductor substrate 30, is referred to as a hollow portion 200. More preferably, the air pressure of the hollow portion 200 is 15 Pa or lower. Still more preferably, the air pressure of the hollow portion 200 is 0.2 Pa or lower.

Preferably, the circuit element 15 or the metal wiring layer 20 is formed below the existence region of the sealing member 160 in plan view. More preferably, both the circuit element 15 and the metal wiring layer 20 are formed below the existence region of the sealing member 160 in plan view. Consequently, as compared with a conventional case where the areas of the circuit element substrate and the metal wiring layer are needed in addition to that of the sensor, the circuit element substrate and the metal wiring layer can be mixedly mounted in the sensor according to the invention by requiring only the area of the sensor. Accordingly, the invention can obtain an advantage in that the area of the entire sensor can be reduced.

Further, although not shown in the drawings, a material (e.g., aluminum) constituting the movable electrode 220 adheres only to a part provided on a surface of the structure 135, which is opposite to the semiconductor substrate, i.e., only to the movable electrode 130 and to a region, in which the through holes 210 are formed in plan view, on the movable plate 80.

First Embodiment

Hereinafter, the circuit configuration, the material, and an operation of a first embodiment having the aforementioned common structure of embodiments of a sensor according to the present invention will be described.

The first embodiment of the invention simultaneously realizes the functions of both of an acceleration sensor and a pressure sensor using the area and volume used by only one sensor.

Figure 3:
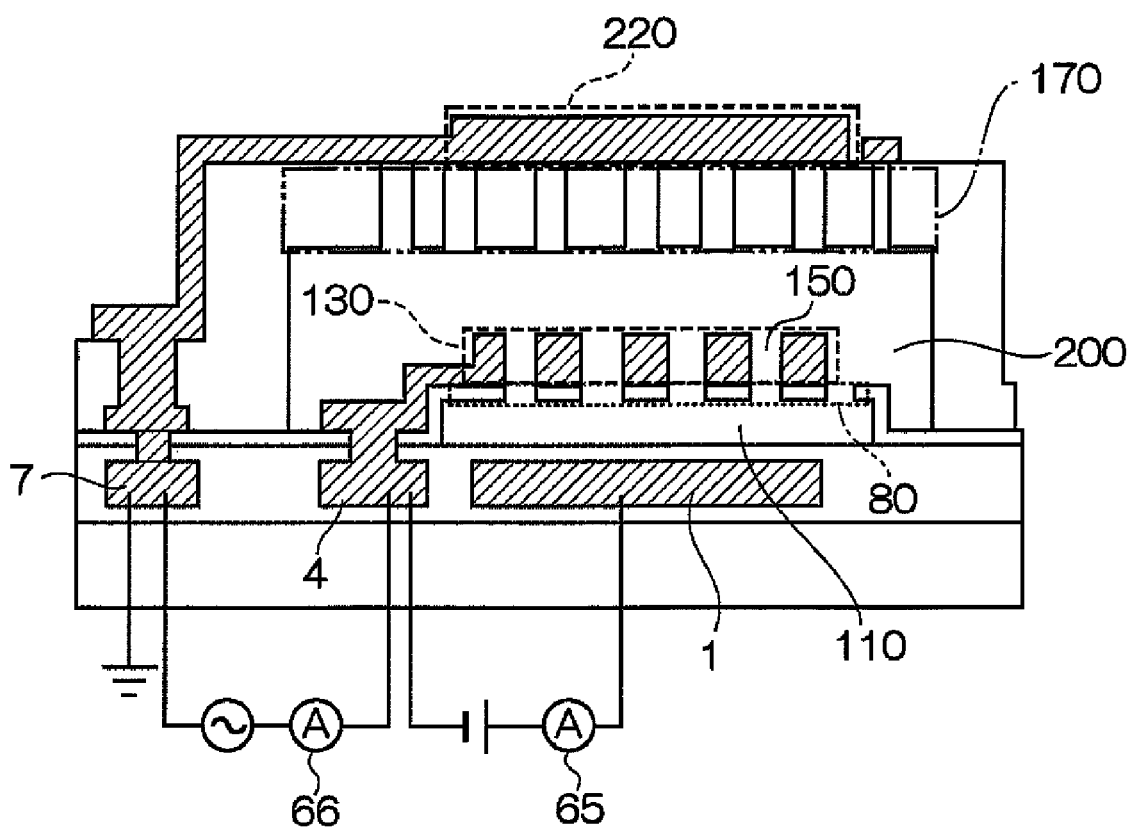
FIG. 3 is a cross-sectional view illustrating a sensor according to a first embodiment of the invention.

First, the circuit configuration of the first embodiment is described with reference to FIG. 3. In the present embodiment, an acceleration detecting circuit and a pressure detecting circuit are used. Further, as illustrated in FIG. 3, a direct-current (DC) power supply and an ammeter (ampere meter) 65 are series-connected between the fixed electrode 1 and the wiring pattern 4. An electric current value read from the ammeter 65 is processed by the acceleration detecting circuit. Incidentally, the DC power supply supplies a set constant voltage. In the following description, DC power supplies are similar thereto. Furthermore, a signal source and an ammeter 66 are series-connected between the wiring patterns 4 and 7. An electric current value read from the ammeter 66 is processed by the pressure detecting circuit. Incidentally, the signal source supplies a voltage signal having a set frequency and a set amplitude. In the following description, signal sources are similar thereto. Preferably, the voltage signal is a sinusoidal signal. Further, in FIG. 3, the DC power supply and the ammeter 65 are illustrated outside the semiconductor substrate 30, for convenience of drawing. However, actually, the DC power supply and the ammeter 65 are formed as a part of the circuit element 15. The DC power supply and the ammeter 65 are connected to the fixed electrode 1 and the wiring pattern 4. Further, these are the same with the signal source and the ammeter 66. Incidentally, the movable electrode 220 is grounded via the wiring pattern 7.

Next, the material of the first embodiment will be described below. That is, in the present embodiment, preferably, the movable electrode 130 is made of an electrically conductive material whose density is 10 g/cm$^3$. More specifically, preferably, the material is tungsten (W), tantalum (Ta), hafnium (Hf), iridium (Ir), platinum (Pt), or gold (Au). According to the invention, most preferably, the material is tungsten (W). This is because tungsten is most frequently used in semiconductor processes and is easily processed, among the aforementioned materials.

Next, an operation of the present embodiment is described below.

First, an operation of the present embodiment serving as an acceleration sensor is described hereinafter. This sensor according to the present embodiment is a capacitive acceleration sensor for detecting an acceleration by detecting a change in the capacitance between the fixed electrode 1 and the movable electrode 130.

A practical operation of this sensor is performed as follows. First, an object, on which the acceleration sensor according to the invention is mounted, is prepared. At that time, a certain electric capacitance is stored between the fixed electrode 1 and the movable electrode 130 using the DC power supply. The stored capacitance is preliminarily read utilizing the ammeter 65. Next, a certain acceleration is applied to this object. Then, the movable plate 80 having the movable electrode 130 is displaced in a direction perpendicular to the semiconductor substrate 30. At that time, a change in the capacitance between the fixed electrode 1 and the movable electrode 130 is caused. After this capacitance change, the value of the capacitance is read utilizing the ammeter 65. Subsequently, a difference between the value of the capacitance before the application of the acceleration and that of the capacitance after the capacitance change is calculated. Thus, an acceleration is detected.

Next, an operation of the present embodiment serving as a pressure sensor is described hereinafter. This sensor according to the present embodiment is a capacitive pressure sensor for detecting a pressure by detecting a change in the capacitance between the movable electrodes 130 and 220.

The practical operation of this sensor is performed as follows. First, an object, on which the pressure sensor according to the invention is mounted, is prepared. At that time, a certain electric capacitance is stored between the movable electrodes 130 and 220 by the DC power supply. The stored capacitance is preliminarily read utilizing the ammeter 66. Next, for example, the atmospheric pressure around this object is changed, whereupon the movable plate 170 having the movable electrode 220 is displaced in a perpendicular direction. Subsequently, the movable plate 170 comes to rest. At this time, a change is generated in the capacitance between the movable electrodes 130 and 220. After this capacitance change, an electric current value is read by the ammeter 66. Then, this current value I is converted into a capacitance value C on the basis of the following relationship: $C=I/(dV/dt)$, where "V" is an output voltage and "t" is time. Subsequently, a difference between the value of the capacitance before the change of the atmospheric pressure and that of the capacitance after the change of the atmospheric pressure is calculated to detect the pressure.

Incidentally, it is considered that in the case of simultaneously detecting an acceleration and a pressure, the displacement between the movable electrodes 130 and 220 may cause a problem in that errors occurs in both the detected values of the acceleration and the pressure. However, regarding this respect, no problem is caused, because the change of the movable electrode 130 due to the acceleration is very fast, as compared with that of the movable electrode 220 due to the pressure, so that the displacement of the movable electrode 220 per unit time, which is required to detect an acceleration, is negligible.

The advantages of the first embodiment of the invention described in the foregoing description are as follows.

First, the sensor according to the first embodiment of the invention includes the fixed electrode 1, the movable electrode 130, and the movable electrode 220. Thus, both of an acceleration sensor and a pressure sensor can simultaneously be implemented using the area and volume used by only one sensor. Consequently, the chip area can be reduced.

Second, the chip volume and weight of the acceleration sensor according to the first embodiment of the invention can considerably be reduced using a silicon oxide film as the material of the sealing member 160, as compared with the conventional case of employing the sealing method using a ceramic or glass package so as to obtain a finishing thickness of about 0.1 mm or more.

Third, the circuit element substrate and the metal wiring layer can be mixedly mounted by forming the sealing member 160 on the circuit element substrate 15 and the metal wiring layer 201, as compared with the conventional case requiring the areas of the circuit element substrate and the metal wiring layer in addition to the area of the existence region of the acceleration sensor. Consequently, the area of the entire acceleration sensor can be reduced.

Fourth, the material of the movable electrode 220, i.e., aluminum adheres only to the surface of the movable electrode 130, which is opposite to the semiconductor substrate 30 of the structure 135, and to a region, in which the through hole 210 is formed in plan view, on the movable electrode 80. Thus, a minute amount of gas discharged from a silicon oxide film can be absorbed by the aluminum. Consequently, the rate of increase in the air pressure can be mitigated.

Fifth, the structure 135 has the through hole 150. Thus, the air pressure of the hollow portion 110 can be equal to that of the hollow portion 200. Stable operations of the hollow plate 80 and the movable electrode 130 can be obtained, as compared with a case where the air pressure of the hollow portion 110 is not equal to that of the hollow portion 200. In addition, an air resistance can be mitigated even in a case where the internal air pressure of the hollow portion 200 rises due to time degradation.

Sixth, the internal air pressure of the hollow portion 200 is equal to or lower than 15 Pa. Thus, the sensor according to the first embodiment of the invention can be used as a pressure sensor. In addition, the air resistance in the case of causing the movable electrode 130 and the movable plate 80 to operate can be reduced. Consequently, the larger amplitude of the movable electrode 130 can be assured. Accordingly, a more accurate acceleration can be detected.

Seventh, the movable electrode 130 is provided in the fixed electrode 1 in plan view. Alternatively, the movable electrode 220 covers the movable electrode 130 in plan view. Thus, the capacitive coupling area therebetween increases. Consequently, the value of the capacitance change between the capacitance before the change and that after the change can be more clearly detected. Accordingly, even in a case where some high-frequency radio wave or the like enters the sensor according to the first embodiment from the outside, the capacitance change due to the pressure change can be differentiated from the influence of the high-frequency radio wave or the like. Thus, in the following description, the reason for enabling more clearly detection of the value of the capacitance change between the capacitance before the pressure change and that after the pressure change by increasing the capacitive coupling area is described using an equation relating to the capacitance value. That is, the capacitance value C is given by:

$$C = \epsilon \cdot S/x$$

where S is a capacitive coupling area, C is an obtained capacitance value, $\epsilon$ is a permittivity, and x is an interelectrode distance. In this case, the capacitance value C is proportional to the capacitive coupling area S. Therefore, the capacitance value can more clearly be detected in proportion to the capacitive coupling area.

Eighth, when the movable electrode 130 vibrates as a weight, a larger amplitude thereof can be obtained by using an electrically conductive material, whose density is 10 g/cm³ or higher, as the material of the movable electrode 130. That is, a larger amplitude can be obtained by using a high density material, which has a less volume and a higher mass, as the material of the movable electrode 130. The smaller the volume of the movable electrode 130 is, the larger the amplitude can be obtained. This is because the spring constant of a movable portion including the movable plate 80 and the movable electrode 130 can be reduced to a small value.

That is, in a case where the area of the movable plate 80 is constant, and where the film thickness and mass of the movable electrode 130 on the movable plate 80 are constant, the higher the density of the material constituting the movable electrode 130 is, the area of the movable electrode 130 can be reduced. Consequently, the coated area of the movable electrode 130 on the movable plate 80 can be reduced. Thus, the mechanical characteristic of the movable portion serving as a vibrating plate can be made closer to that only of the movable plate 80. Accordingly, the spring constant of the vibrating plate can be reduced. The larger the mass of the movable electrode 130 is, the larger the amplitude can be obtained. The reason is described below using the relational expression representing the relationship between the mass and amplitude of a weight. In addition to the aforementioned amplitude X, the spring constant of the vibrating plate 80 and the weight of the movable electrode 130, and an acceleration are designated with "k", "m", and "a", respectively.

Incidentally, the acceleration a and the spring constant k are assumed to be constant. At that time, the amplitude X is defined as $X = m \cdot a/k$. Thus, the amplitude X is proportional to the weight m of the movable electrode. Consequently, the amplitude of the movable portion including the movable electrode 130 and the vibrating plate 80 increases in proportional to the weight of the movable electrode 130. Further, as a result of obtaining a larger amplitude, the capacitance difference corresponding to the capacitance change is more clearly obtained. The reason is described below. First, the permittivity $\epsilon$ and the capacitive coupling area S are fixed in the expression giving the capacitance value C:

$$C = \epsilon \cdot S/x.$$

where C, $\epsilon$, S, and x are defined above. Then, in this case, the electric capacitance change can be determined by the change of the interelectrode distance x.

Therefore, the capacitance difference corresponding to the capacitance change is proportional to the change of the interelectrode distance x. When a larger amplitude is obtained, the value of the capacitance difference corresponding to the capacitance change between the capacitance before the vibration of the movable electrode 130 and that after the vibration thereof is increased. Due to the above reason, the difference corresponding to the capacitance change can be made clearer. Thus, the more accurate detection of the acceleration can be achieved. This makes the difference corresponding to the capacitance change clearer. Consequently, a more accurate detection of the acceleration can be achieved.

Ninth, in a case where the intersection point of the diagonal lines of each of the movable electrode 130 and the movable plate 80 is set as a central portion, and where the central portions of the movable electrode 130 and the movable plate 80 overlap, in plan view, with each other. Further, in a case where the intersection point of the diagonal lines of each of the movable electrode 220 and the movable plate 170 is set as a central portion, and where the central portions of the movable electrode 220 and the movable plate 170 overlap, in plan view, with each other. Consequently, the amplitude of each of the movable plates 80 and 170 is most permissible.

Tenth, the movable plates 80 and 170 are formed of silicon oxide films. Thus, the movable plates 80 and 170 can be distorted. Consequently, the movable plate 80 or 170 can be displaced together with the movable electrode 130 or 220. Accordingly, an operation of the present embodiment can be implemented.

Eleventh, the wiring portion 7 is grounded. Thus, the movable electrode 220 can be used also as a noise shield. Incidentally, the noise shield is defined as a shield that absorbs a noise serving as a high-frequency unwanted signal input from the outside to prevent the noise from reaching the movable electrode 130. Consequently, the influence of the noise on the capacitance value of the movable electrode 130 can be reduced. Thus, the more accurate detection of capacitance can be achieved between the fixed electrode 1 and the movable electrode 130, and between the movable electrodes 130 and 220. An operation in this case is described below. That is, when a high-frequency noise input from the outside reaches the movable electrode 220, the unwanted signal flows to a ground level point through the wiring pattern 7 grounded via the wiring pattern 230.

Consequently, the high-frequency unwanted signal input to the sensor from the outside does not reach the movable electrode 130. Consequently, the values of the capacitance between the movable electrodes 130 and 220 and the capacitance between the movable electrode 130 and the fixed electrode 1 are not affected. Incidentally, no current flows in the ammeter 66, because the noise flows to a grounded low-resistance side.

Second Embodiment

Hereinafter, the circuit configuration, the material, and an operation of a second embodiment having the aforementioned common structure of embodiments of a sensor according to the present invention will be described.

The second embodiment of the invention simultaneously implements both of a magnetic sensor and a pressure sensor by using only the area and volume of one sensor. Incidentally, the magnetic sensor described in the present embodiment is used for measuring a static magnetic field. In the following description, magnetic sensors are similar thereto.

Figure 4:
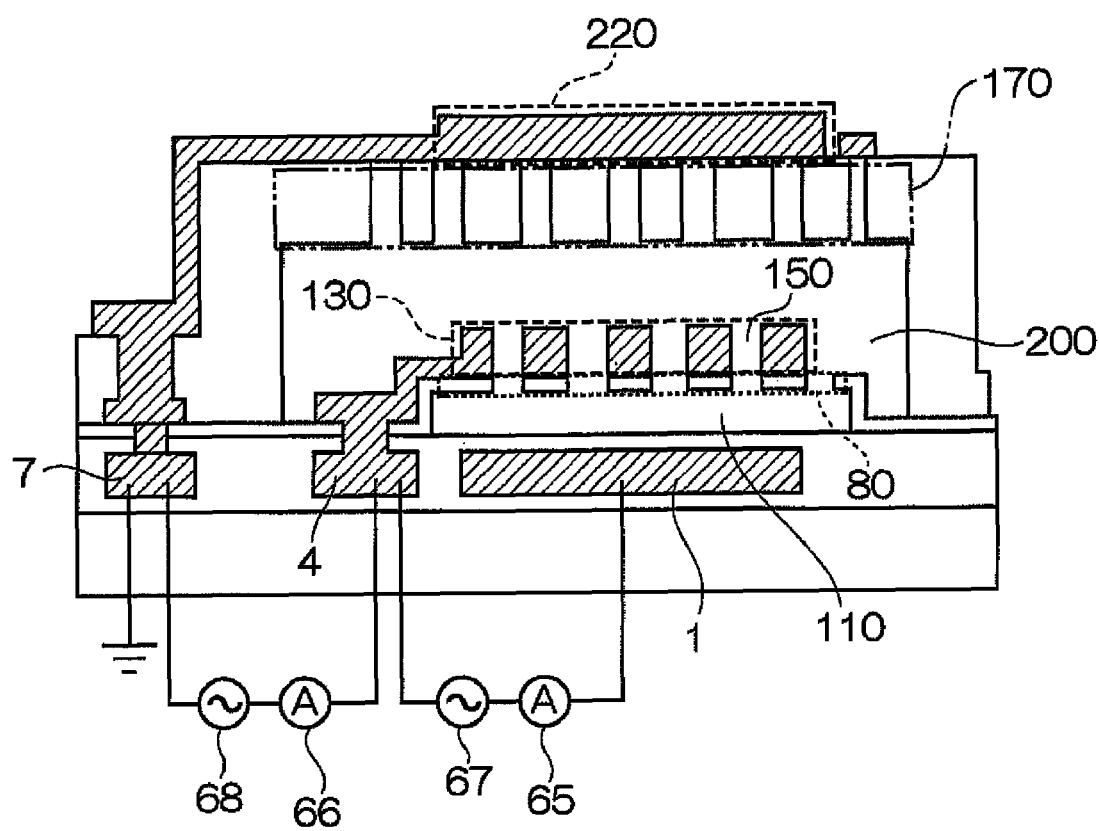
FIG. 4 is a cross-sectional view illustrating a sensor according to a second embodiment of the invention.

The circuit configuration of the second embodiment is described with reference to FIG. 4. The present embodiment uses a magnetism detecting circuit. Further, as illustrated in FIG. 4, a signal source 67 and an ammeter 65 are series-connected between the fixed electrode 1 and the wiring pattern 4. A current value read from the ammeter 65 is processed by the magnetism detecting circuit. Furthermore, a signal source 68 and an ammeter 66 are series-connected between the wiring patterns 4 and 7. A current value read from the ammeter 66 is processed by a pressure detecting circuit. Incidentally, in FIG. 4, a signal source 67 and the ammeter 65 are illustrated outside the semiconductor substrate 30, for convenience of drawing. However, actually, the signal source 67 and the ammeter 65 are formed as a part of the circuit element 150. The signal source 67 and the ammeter 65 are connected to the fixed electrode 1 and the wiring pattern 4 via a metal wiring layer 20. Further, these are the same with the signal source 68 and the ammeter 66.

Next, the material of the second embodiment is described below. That is, in the present embodiment, preferably, the movable electrode 130 is made of a ferromagnetic material. More specifically, preferably, the material is nickel (Ni), iron (Fe), or cobalt (Co). According to the invention, most preferably, the material is nickel (Ni). This is because tungsten is most frequently used in semiconductor processes and is easily processed, among the aforementioned materials.

Next, an operation of the present embodiment is described below.

First, an operation of the present embodiment serving as a magnetic sensor is described hereinafter. This sensor according to the present embodiment is a capacitive magnetic sensor for detecting magnetism by detecting a change in the capacitance between the fixed electrode 1 and the movable electrode 130.

A practical operation of this sensor is performed as follows. First, an object, on which the magnetic sensor according to the invention is mounted, is prepared. At that time, a certain electric capacitance is stored between the fixed electrode 1 and the movable electrode 130. The stored capacitance is preliminarily read utilizing the ammeter 65. Next, this object is exposed to a certain magnetic field. Then, the movable plate 80 having the movable electrode 130 is displaced in a direction perpendicular to the semiconductor substrate. Subsequently, the movable plate 80 comes to rest. At that time, a change in the capacitance between the fixed electrode 1 and the movable electrode 130 is caused. After this capacitance change, an electric current value is read by the ammeter 67. Then, this current value I is converted into a capacitance value C on the basis of the following relation: $C=I/(dV/dt)$. Subsequently, a magnetic flux density is calculated from a difference between the value of the capacitance before the object is exposed to the magnetic field, and that of the capacitance after the object is exposed to the magnetic field. Thus, magnetism is detected.

Next, an operation of the present embodiment serving as a pressure sensor is described hereinafter. This sensor according to the present embodiment is a capacitive pressure sensor for detecting a pressure by detecting a change in the capacitance between the movable electrodes 130 and 220.

A practical operation of this sensor is performed as follows. First, an object, on which the pressure sensor according to the invention is mounted, is prepared. At that time, a certain electric capacitance is stored between the movable electrodes 130 and 220. The stored capacitance is preliminarily read utilizing the ammeter 66. Next, for example, an atmospheric pressure around this object is changed. Then, the movable plate 170 having the movable electrode 220 is displaced in a direction perpendicular to the semiconductor substrate. Subsequently, the movable plate 170 comes to rest. At that time, a change in the capacitance between the movable electrodes 130 and 220 is caused. After this capacitance change, an electric current value is read by the ammeter 66. Then, this current value I is converted into a capacitance value C on the basis of the following relation: $C=I/(dV/dt)$. Subsequently, a difference between the value of the capacitance before the change of the atmospheric pressure and that of the capacitance after the change of the atmospheric pressure is calculated. Thus, a pressure is detected.

Incidentally, it is considered that in the case of simultaneously detecting magnetism and a pressure, the displacement between the movable electrodes 130 and 220 may cause a problem in that errors occurs in both the detected values of the magnetism and the pressure. However, regarding this respect, no problem is caused according to the property of the magnetic sensor of the invention configured to preliminarily read a value of magnetism as a reference value in a state in which the sensor is placed under a certain atmospheric pressure, and in which subsequently, the difference corresponding to the capacitance change from the capacitance corresponding to the preliminarily read magnetism is read.

The advantages of the second embodiment of the invention described in the foregoing description are as follows.

First, the sensor according to the second embodiment of the invention includes the fixed electrode 1, the movable electrode 130, and the movable electrode 220. Thus, both of a magnetic sensor and a pressure sensor can simultaneously be implemented by only the area and volume of a semiconductor chip to be used to fabricate one sensor. Consequently, the chip area can be reduced.

Second, the chip volume and weight of the acceleration sensor according to the first embodiment of the invention can considerably be reduced using a silicon oxide film as the material of the sealing member 160, as compared with the conventional case of employing the sealing method using a ceramic or glass package so as to obtain a finishing thickness of about 0.1 mm or more.

Third, a ferromagnetic material is used as the material of the movable electrode 130. Thus, the sensor according to the second embodiment can be used as a magnetic sensor.

Fourth, the second embodiment can obtain advantages similar to the third, fourth, seventh, ninth, tenth and eleventh advantages of the first embodiment.

Third Embodiment

Hereinafter, the circuit configuration, the material, and an operation of a third embodiment having the aforementioned common structure of embodiments of a sensor according to the present invention will be described.

The third embodiment of the invention simultaneously implements both of an acceleration sensor and a pressure sensor by using only the area and volume of one sensor. In addition, the sensor according to the third embodiment can be used as the acceleration sensor or the pressure sensor according to need by flicking a switch.

Figure 5:
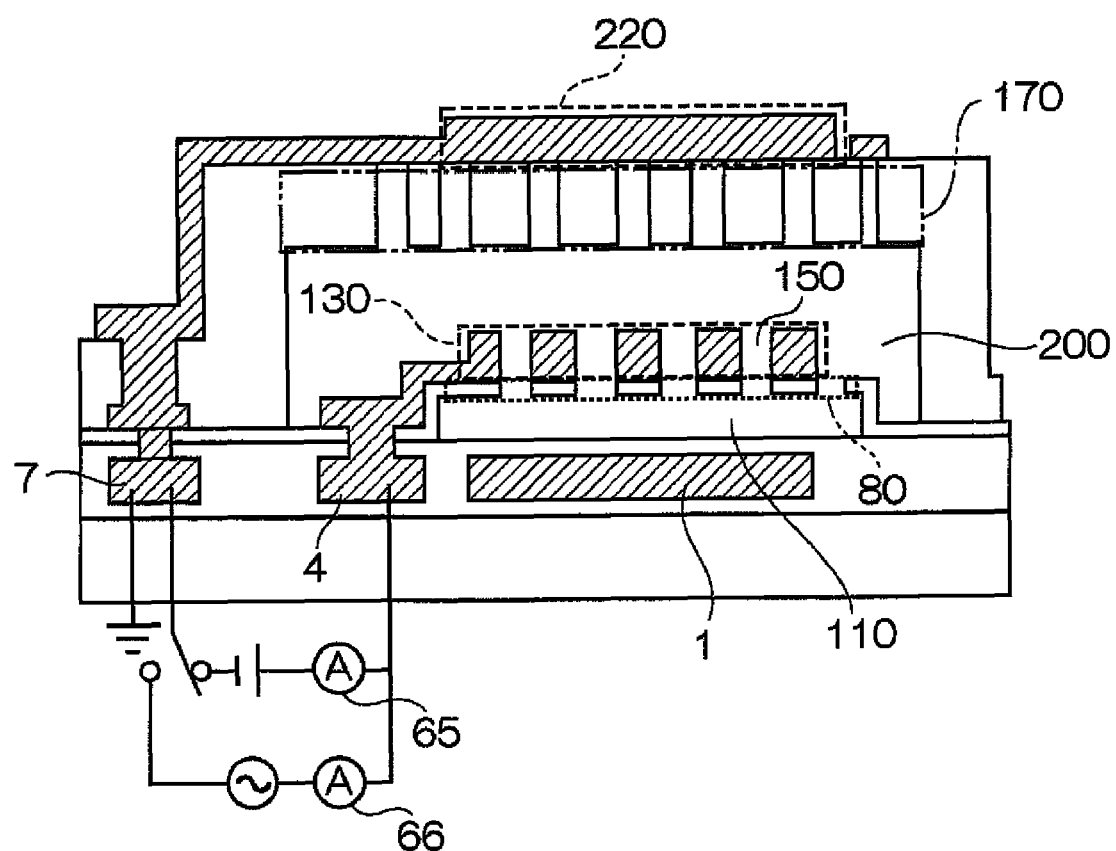
FIG. 5 is a cross-sectional view illustrating a sensor according to a third embodiment of the invention.

First, the circuit configuration of the third embodiment is described with reference to FIG. 5. The present embodiment uses an acceleration detecting circuit and a pressure detecting circuit. Further, as illustrated in FIG. 5, a DC power supply and an ammeter 65 are series-connected to the wiring patterns 4 and 7. A current value read from the ammeter 65 is processed by the acceleration detecting circuit. Furthermore, a signal source and an ammeter 66 are series-connected between the wiring patterns 4 and 7 in parallel with the DC power supply and the ammeter 65. A current value read from the ammeter 66 is processed by the pressure detecting circuit. Further, in FIG. 5, the DC power supply and the ammeter 65 are illustrated outside the semiconductor substrate 30, for convenience of drawing. However, actually, the DC power supply and the ammeter 65 are formed as a part of the circuit element 15. The DC power supply and the ammeter 65 are connected to the wiring patterns 4 and 7 via the metal wiring layer 20. Further, these are the same with the signal source and the ammeter 66. Incidentally, the movable electrode 220 is grounded via the wiring pattern 7.

The material of the third embodiment is similar to that of the first embodiment of the invention.

Next, an operation of the present embodiment is described hereinafter.

First, an operation of the present embodiment serving as an acceleration sensor is described hereinafter. This sensor according to the present embodiment is a capacitive acceleration sensor for detecting an acceleration by detecting a change in the capacitance between the movable electrodes 130 and 220.

A practical operation of this sensor is performed as follows. First, an object, on which the pressure sensor according to the invention is mounted, is prepared. In this case, a switch is connected to the circuit constituted by the DC power supply and the ammeter 65. The switch is not connected to the signal source and the ammeter 66. At that time, a certain electric capacitance is stored between the movable electrodes 130 and 220 using the DC power supply. The stored capacitance is preliminarily read utilizing the ammeter 65.

Next, a certain acceleration is applied to this object. Then, the movable plate 80 having the movable electrode 130 is displaced in a direction perpendicular to the semiconductor substrate 30. At that time, a change in the capacitance between the movable electrodes 130 and 220 is caused. After this capacitance change, the value of the capacitance is read utilizing the ammeter 65. Subsequently, a difference between the value of the capacitance before the application of the acceleration and that of the capacitance after the capacitance change is caused is calculated. Thus, an acceleration is detected.

Next, an operation of the present embodiment serving as a pressure sensor is described hereinafter. This sensor according to the present embodiment is a capacitive pressure sensor for detecting a pressure by detecting a change in the capacitance between the movable electrodes 130 and 220.

A practical operation of this sensor is performed as follows. First, an object, on which the pressure sensor according to the invention is mounted, is prepared. In this case, the switch is connected to the circuit constituted by an alternating-current (AC) power supply and an ammeter 66. The signal source and the ammeter 65 are not connected to the switch. First, a certain electric capacitance is stored between t the movable electrodes 130 and 220. The stored capacitance is preliminarily read utilizing the ammeter 66.

Next, for example, an atmospheric pressure around this object is changed. Then, the movable plate 170 having the movable electrode 220 is displaced in a direction perpendicular to the semiconductor substrate. Subsequently, the movable plate 170 comes to rest. At that time, a change in the capacitance between the movable electrodes 130 and 220 is caused. After this capacitance change, an electric current value is read by the ammeter 66. Then, this current value I is converted into a capacitance value C on the basis of the following relation: $C=I/(dV/dt)$. Subsequently, a difference between the value of the capacitance before the change of the atmospheric pressure and that of the capacitance after the change of the atmospheric pressure is calculated. Thus, a pressure is detected.

Incidentally, it is considered that in the case of simultaneously detecting an acceleration and a pressure, the displacement between the movable electrodes 130 and 220 may cause a problem in that errors occurs in both the detected values of the acceleration and the pressure. However, regarding this respect, no problem is caused, because the change of the movable electrode 130 due to the acceleration is very fast, as compared with that of the movable electrode 220 due to the pressure, so that the displacement of the movable electrode 220 per unit time, which is required to detect an acceleration, is negligible.

The advantages of the third embodiment of the invention described in the foregoing description are as follows.

First, the sensor according to the third embodiment of the invention includes the fixed electrode 1, the movable electrode 130, and the movable electrode 220. Thus, both of an acceleration sensor and a pressure sensor can simultaneously be implemented by only the area and volume of a semiconductor chip to be used to fabricate one sensor. Consequently, the sensor according to the third embodiment can be used as an acceleration sensor or a pressure sensor according to need by flicking the switch. Accordingly, the chip area can be reduced.

Second, the third embodiment can obtain advantages similar to the second to the twelfth advantages of the first embodiment.

Third, the fixed electrode 1, which is used as an electrode according to the first embodiment, can be used as an ordinary wiring.

Fourth Embodiment

Hereinafter, the circuit configuration, the material, and an operation of a fourth embodiment having the aforementioned common structure of embodiments of a sensor according to the present invention will be described.

The fourth embodiment of the invention simultaneously implements both of a magnetic sensor and a pressure sensor by using only the area and volume of one sensor. Incidentally, the magnetic sensor described in the present embodiment is used for measuring a magnetic field. In addition, the sensor according to the fourth embodiment can be used as the magnetic sensor or the pressure sensor according to need by flicking a switch.

Figure 6:
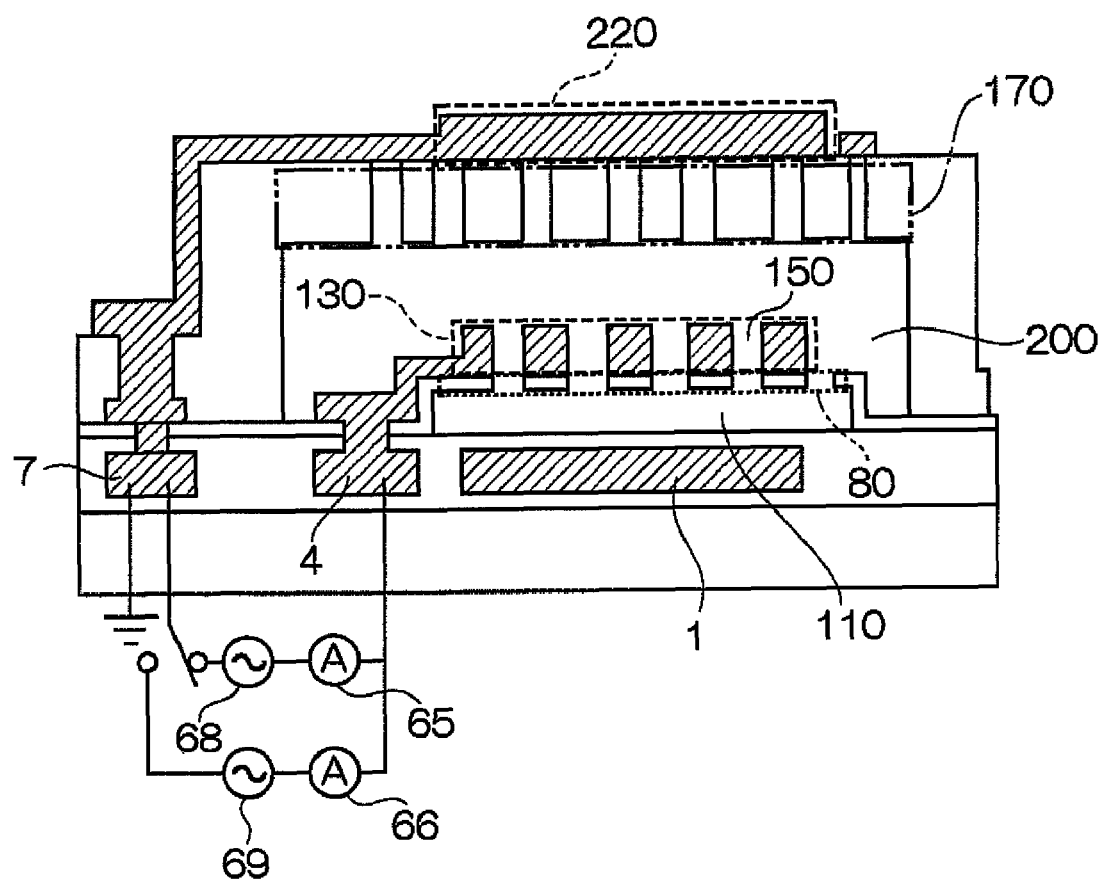
FIG. 6 is a cross-sectional view illustrating a sensor according to a fourth embodiment of the invention.

First, the circuit configuration of the fourth embodiment is described with reference to FIG. 6. The present embodiment uses a magnetism detecting circuit and a pressure detecting circuit. Further, as illustrated in FIG. 6, a signal source 69 and an ammeter 66 are series-connected between the wiring patterns 4 and 7. A current value read from the ammeter 66 is processed by the pressure detecting circuit. Furthermore, the signal source 69 and the ammeter 66 are series-connected between the wiring patterns 4 and 7 in parallel with the signal source 68 and the ammeter 65. A current value read from the ammeter 66 is processed by the pressure detecting circuit.

Incidentally, in FIG. 6, the DC power supply and the ammeter 65 are illustrated outside the semiconductor substrate 30, for convenience of drawing. However, actually, the DC power supply and the ammeter 65 are formed as a part of the circuit element 15. The DC power supply and the ammeter 65 are connected to the fixed electrode 1 and the wiring portion 4 via the metal wiring layer 20. Further, these are the same with the signal source and the ammeter 66. Incidentally, the movable electrode 220 is grounded via the wiring pattern 7.

The material of the present embodiment is similar to that of the second embodiment of the invention.

Next, an operation of the present embodiment is described below.

First, an operation of the present embodiment serving as a magnetic sensor is described hereinafter. This sensor according to the present embodiment is a capacitive magnetic sensor for detecting magnetism by detecting a change in the capacitance between the movable electrodes 130 and 220.

A practical operation of this sensor is performed as follows. First, an object, on which the magnetic sensor according to the invention is mounted, is prepared. Incidentally, the switch is connected to a circuit constituted by signal source 68 and the ammeter 65. The signal source 69 and the ammeter 66 are not connected to the switch. Then, the capacitance between the movable electrodes 130 and 220 is preliminarily measured. Next, this object is exposed to a certain magnetic field. Then, the movable plate 170 having the movable electrode 220 is displaced in a direction perpendicular to the semiconductor substrate. Subsequently, the movable plate 170 comes to rest. At that time, a change in the capacitance between the movable electrodes 130 and 220 is caused. After this capacitance change, an electric current value is read by the ammeter 65. Then, this current value I is converted into a capacitance value C on the basis of the following relation: $C=I/(dV/dt)$. Subsequently, a magnetic flux density is calculated from a difference between the value of the capacitance before the object is exposed to the magnetic field, and that of the capacitance after the object is exposed to the magnetic field. Thus, magnetism is detected.

An operation of the present embodiment serving as a pressure sensor is similar to that of the pressure sensor according to the third embodiment.

Incidentally, it is considered that in the case of simultaneously detecting magnetism and a pressure, the displacement between the movable electrodes 130 and 220 may cause a problem in that errors occurs in both the detected values of the magnetism and the pressure. However, regarding this respect, no problem is caused according to the property of the magnetic sensor of the invention configured to preliminarily read a value of magnetism as a reference value in a state in which the sensor is placed under a certain atmospheric pressure, and in which subsequently, the difference corresponding to the capacitance change from the capacitance corresponding to the preliminarily read magnetism is read.

The advantages of the fourth embodiment of the invention described in the foregoing description are as follows.

First, the sensor according to the fourth embodiment of the invention includes the fixed electrode 1, the movable electrode 130, and the movable electrode 220. Thus, both of an acceleration sensor and a pressure sensor can simultaneously be implemented by only the area and volume of a semiconductor chip to be used to fabricate one sensor. Consequently, the sensor according to the fourth embodiment can be used as an acceleration sensor or a pressure sensor according to need by flicking the switch. Accordingly, the chip area can be reduced.

Second, the fourth embodiment of the invention can obtain advantages similar to the second to fourth advantages of the second embodiment of the invention.

Third, the fourth embodiment of the invention can obtain an advantage similar to the third advantage of the embodiment of the invention.

Fifth Embodiment

Hereinafter, the circuit configuration, the material, and an operation of a fifth embodiment having the aforementioned common structure of embodiments of a sensor according to the present invention will be described.

The fifth embodiment of the invention simultaneously implements both of a magnetic sensor and an acceleration sensor by using only the area and volume of one sensor.

Figure 7:
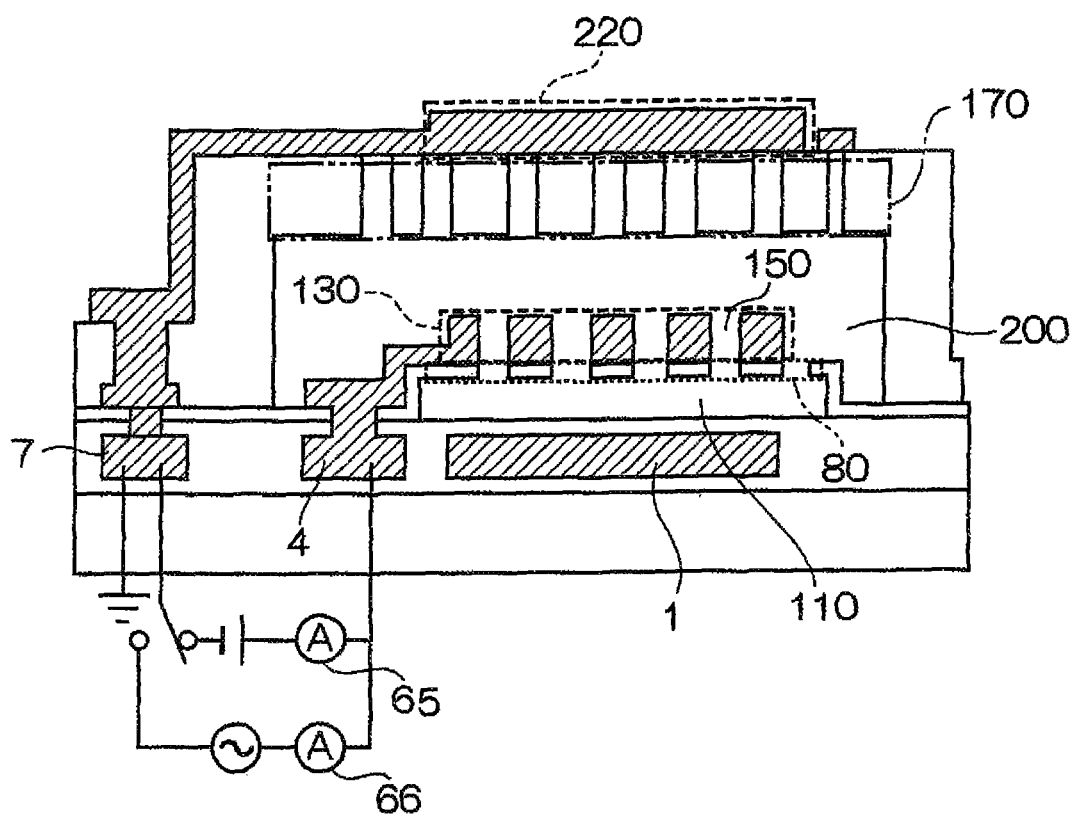
FIG. 7 is a cross-sectional view illustrating a sensor according to a fifth embodiment of the invention.

First, the circuit configuration of the fifth embodiment is described with reference to FIG. 7. The present embodiment uses an acceleration detecting circuit and a magnetism detecting circuit. Further, as illustrated in FIG. 7, a DC power supply and an ammeter 65 are series-connected between the wiring pattern 7 and the wiring pattern 4. An electric current value read from the ammeter 65 is processed by the acceleration detecting circuit. Furthermore, a signal source and an ammeter 66 are series-connected between the wiring patterns 4 and 7. An electric current value read from the ammeter 66 is processed by the magnetism detecting circuit. Incidentally, in FIG. 7, the DC power supply and the ammeter 65 are illustrated outside the semiconductor substrate 30, for convenience of drawing. However, actually, the DC power supply and the ammeter 65 are formed as a part of the circuit element 15. The DC power supply and the ammeter 65 are connected to the wiring pattern 7 and the wiring pattern 4 via the metal wiring layer 20. Further, these are the same with the signal source and the ammeter 66. Incidentally, the movable electrode 220 is grounded via the wiring pattern 7.

Next, the material of the fifth embodiment is described below. That is, in the present embodiment, preferably, the movable electrode 130 is made of a ferromagnetic material. More specifically, preferably, the material is nickel (Ni), iron (Fe), or cobalt (Co). According to the invention, most preferably, the material is nickel (Ni). This is because tungsten is most frequently used in semiconductor processes and is easily processed, among the aforementioned materials.

Next, an operation of the present embodiment is described below.

First, an operation of the present embodiment serving as an acceleration sensor is described hereinafter. This sensor according to the present embodiment is a capacitive acceleration sensor for detecting an acceleration by detecting a change in the capacitance between the movable electrode 220 and the movable electrode 130.

A practical operation of this sensor is performed as follows. First, an object, on which the acceleration sensor according to the invention is mounted, is prepared. In this case, a switch is connected to the circuit constituted by the DC power supply and the ammeter 65. The signal source and the ammeter 66 are not connected to the switch. Then, a certain electric capacitance is stored between the wiring patterns 4 and 7 using the DC power supply. The stored capacitance is preliminarily read utilizing the ammeter 65. Next, a certain acceleration is applied to this object. Then, the movable plate 80 having the movable electrode 130 is displaced in a direction perpendicular to the semiconductor substrate 30. At that time, a change in the capacitance between the movable electrodes 130 and 220 is caused. After this capacitance change, the value of the capacitance is read utilizing the ammeter 65. Subsequently, a difference between the value of the capacitance before the application of the acceleration and that of the capacitance after the capacitance change is caused is calculated. Thus, an acceleration is detected.

Next, an operation of the present embodiment serving as a magnetic sensor is described hereinafter. This sensor according to the present embodiment is a capacitive magnetic sensor for detecting magnetism by detecting a change in the capacitance between the movable electrodes 130 and 220.

That is, the case of using the sensor according to the present embodiment as a magnetic sensor is described hereinafter This magnetic sensor according to the present embodiment is a capacitive magnetic sensor for detecting magnetism by detecting a change in the capacitance between the movable electrodes 130 and 220.

A practical operation of this sensor is performed as follows. First, an object, on which the magnetic sensor according to the invention is mounted, is prepared. Incidentally, the switch is connected to a circuit constituted by the signal source and the ammeter 66. The DC power supply and the ammeter 65 are not connected to the switch. Then, the capacitance between the movable electrodes 130 and 220 is preliminarily measured. Next, this object is exposed to a certain magnetic field. Then, the movable plate 170 having the movable electrode 220 is displaced in a direction perpendicular to the semiconductor substrate. Subsequently, the movable plate 170 comes to rest. At that time, a change in the capacitance between the movable electrodes 130 and 220 is caused. After this capacitance change, an electric current value is read by the ammeter 66. Then, this current value I is converted into a capacitance value C on the basis of the following relation: C=I/(dV/dt). Subsequently, a magnetic flux density is calculated from a difference between the value of the capacitance before the object is exposed to the magnetic field, and that of the capacitance after the object is exposed to the magnetic field. Thus, magnetism is detected.

Incidentally, it is considered that in the case of simultaneously detecting magnetism and an acceleration, the displacement between the movable electrodes 130 and 220 may cause a problem in that errors occurs in both the detected values of the magnetism and the acceleration. Further, it is also considered that countermeasures against this are required. However, actually, such countermeasures are unnecessary. This is because the change of the movable electrode 130 due to the magnetism is very slow, as compared with that of the movable electrode 130 due to the acceleration, so that the displacement of the movable electrode 130 per unit time, which is required to detect an acceleration, is negligible.

Incidentally, in the present embodiment, an acceleration is detected using the movable electrode 220 and the movable electrode 130. Further, magnetism is detected using the movable electrodes 130 and 220. However, magnetism can be detected using the fixed electrode 1 and the movable electrode 130. An acceleration can be detected using the movable electrodes 130 and 220.

The advantages of the fifth embodiment of the invention described in the foregoing description are as follows.

First, the sensor according to the present embodiment of the invention includes the fixed electrode 1, the movable electrode 130, and the movable electrode 220. Thus, both of a magnetism sensor and an acceleration sensor can simultaneously be implemented by only the area and volume of a semiconductor chip to be used to fabricate one sensor. Consequently, the chip area can be reduced.

Second, the chip volume and weight of the magnetism sensor according to the present embodiment of the invention can considerably be reduced using a silicon oxide film as the material of the sealing member 160, as compared with the conventional case of employing, when the movable plate of the acceleration sensor or the magnetic sensor is sealed, the sealing method using a ceramic or glass package so as to obtain a finishing thickness of about 0.1 mm or more.

Third, a ferromagnetic material is used as the material of the movable electrode 130. Consequently, the sensor according to the fifth embodiment can be used as a magnetic sensor.

Fourth, the fifth embodiment can obtain advantages similar to the third to seventh, the ninth, and the eleventh advantages of the first embodiment.

Sixth Embodiment

Hereinafter, the circuit configuration, the material, and an operation of a sixth embodiment having the aforementioned common structure of embodiments of a sensor according to the present invention are described.

According to the sixth embodiment of the invention, the value of the capacitance between the fixed electrode 1 and the movable electrode 130 and that of the capacitance between the movable electrodes 130 and 220 are detected using a differential amplifier. Thus, a noise serving as a high-frequency unwanted signal input to the sensor from the outside can be removed. Consequently, a change in the capacitance therebetween can more accurately be read. Accordingly, an acceleration can more accurately be detected.

Figure 8:
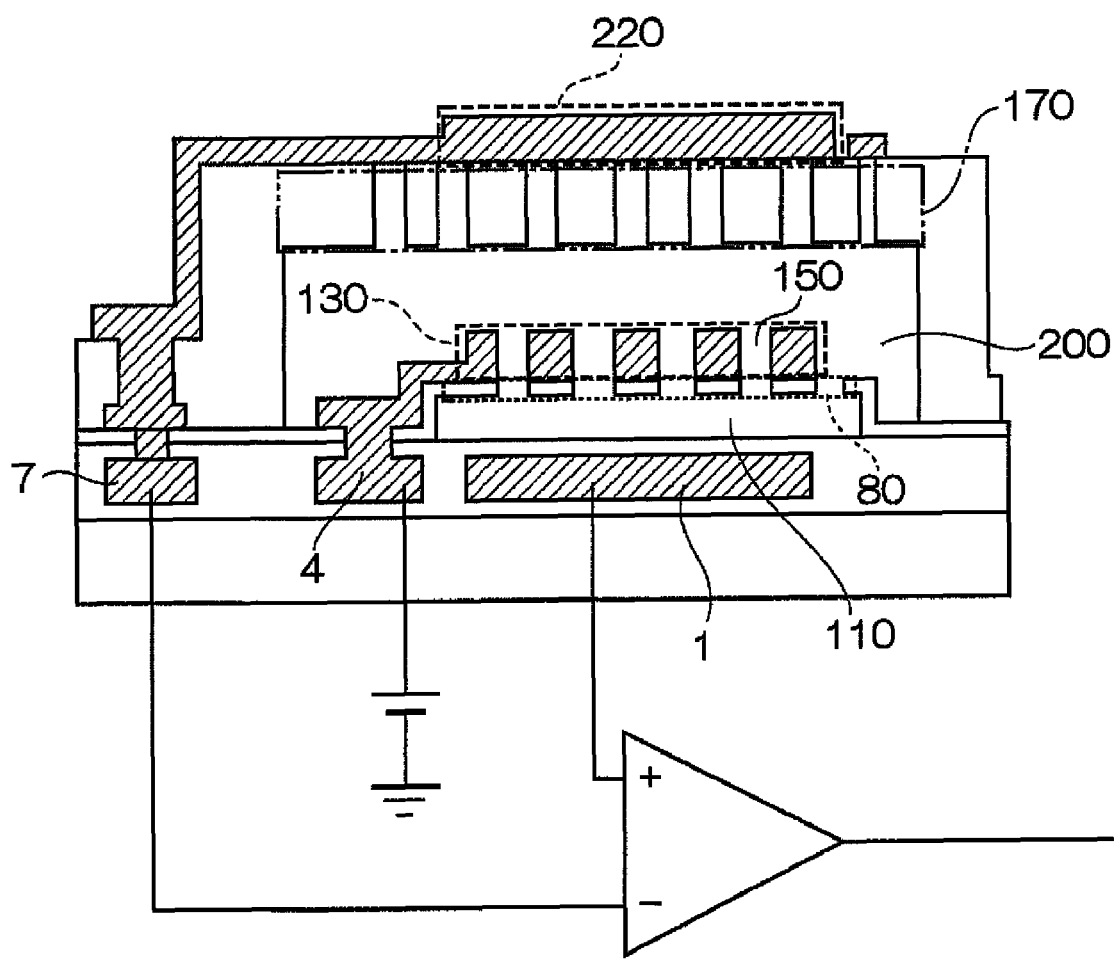
FIG. 8 is a cross-sectional view illustrating a sensor according to a sixth embodiment of the invention.

First, the circuit configuration of the sixth embodiment is described with reference to FIG. 8. The present embodiment uses an acceleration detecting circuit. In addition, the present embodiment uses a differential amplifier incorporating an ammeter. The non-inverting input terminal of the differential amplifier is connected to the fixed electrode 1. The inverting input terminal of differential amplifier is connected to the wiring pattern 7. Further, the wiring pattern 4 is grounded via the DC power supply. Furthermore, the wiring pattern 7 is grounded.

The material of the fifth embodiment of the invention is similar to that of the first embodiment of the invention.

Next, an operation of the present embodiment is described below. An acceleration sensor according to the sixth embodiment of the invention is such that the value of the capacitance between the fixed electrode 1 and the movable electrode 130 and that of the capacitance between the movable electrodes 130 and 220 are detected using the differential amplifier. Thus, a noise serving as a high-frequency unwanted signal input to the acceleration sensor from the outside can be removed. Consequently, a change in the capacitance therebetween can more accurately be read. Accordingly, an acceleration can more accurately be detected.

A practical operation of the sixth embodiment of the invention is performed as follows. First, an object, on which an acceleration sensor according to the invention is mounted, is prepared. A constant voltage is applied to between the wiring patterns 4 and 7 using a DC power supply. In a case where no acceleration is detected, no electric current flows therebetween. Next, an acceleration is applied to this object. Then, the movable plate 80 having the movable electrode 130 is displaced in a direction perpendicular to the semiconductor substrate 30. At that time, each of a change A in the capacitance between the fixed electrode 1 and the movable electrode 130 per unit time, and a change B in the capacitance between the movable electrodes 130 and 220 per unit time are read as a change in electric charge per unit time, i.e., an electric current. At that time, the phase of the change A is shifted from the phase B by 180 degrees. Thus, both the changes A and B are read by adjusting the phase of the change A and that of the change B to the same phase. Consequently, the sixth embodiment can achieve not only the enhancement of the signal strength but the removal of the noise of the same phase through the differential amplifier.

Incidentally, it is considered that when an acceleration is detected, the displacement of the movable electrode 220 affects an error of the value of the capacitance between the movable electrodes 130 and 220. However, regarding this respect, no problem is caused, because the change of the movable electrode 130 due to the acceleration is very fast, as compared with that of the movable electrode 220 due to the pressure, so that the displacement of the movable electrode 220 per unit time, which is required to detect an acceleration, is negligible.

The advantages of the sixth embodiment of the invention described in the foregoing description are as follows.

First, in the sensor according to the sixth embodiment of the invention, the value of the capacitance between the fixed electrode 1 and the movable electrode 130 and that of the capacitance between the movable electrodes 130 and 220 are detected using the differential amplifier. Thus, a noise serving as a high-frequency unwanted signal input to the sensor from the outside can be removed. Consequently, a change in the capacitance therebetween can be read more accurately. Accordingly, an acceleration can be detected more accurately.

Second, the sixth embodiment can obtain advantages similar to the second to eleventh advantages of the first embodiment.

Seventh Embodiment

Next, a seventh embodiment of the present invention will be described with reference to FIGS. 9A to 10. The seventh embodiment is a sensor manufacturing method according to the invention.

A sensor manufacturing method according to the seventh embodiment of the invention includes:

a) a first step of preparing a semiconductor substrate 30 having a fixed electrode 1 as a first electrode, b) a second step of forming a first sacrificing film serving as a first deposition film deposited on the semiconductor substrate 30, c) a third step of coating the first sacrificing film 300 with a first insulating film 70, d) a fourth step of forming a movable electrode 130 serving as a second electrode on the first insulating film 70 coated on the sacrificing film 300, e) a fifth step of forming a through hole 150 serving as a first opening portion configured to expose a part of the first sacrificing film 300 by penetrating the movable electrode 130 serving as the second electrode and the first insulating film 70 or penetrating the first insulating film 70, f) a sixth step of coating the second electrode and the first insulating film 70, which is coated on the first sacrificing film 300, with a second sacrificing film 310 serving as a second deposition film, g) a seventh step of coating the second sacrificing film 310 with a sealing member 160 serving as a second insulating film, h) an eighth step of forming a through hole 210 serving as a second opening portion that exposes a part of the second sacrificing film by penetrating the sealing layer 160 coated on the second sacrificing film 310, i) a ninth step of removing the first sacrificing film and the second sacrificing film through the through holes 150 and 210, and j) a tenth step of forming a movable electrode 220 serving as a third electrode by blocking up the through hole 220.

Hereinafter, a method for manufacturing a sensor according to the embodiments of the structure of the invention is described as the seventh embodiment of the invention in detail.

Figure 9A:
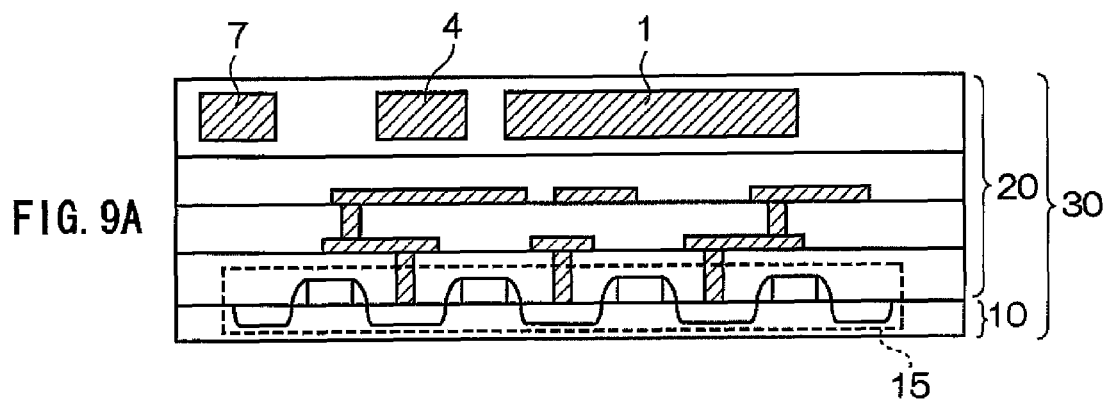
FIGS. 9A to 9K are cross-sectional views illustrating a manufacturing method according to the invention.

First, as illustrated in FIG. 9A, a semiconductor substrate 30 having a fixed electrode 1 serving as a first electrode is prepared. Incidentally, the semiconductor substrate 30 has a structure similar to the common structure according to the invention. The semiconductor substrate 30 includes the circuit element substrate 10, on which the circuit element 15 is formed, and the metal wiring layer 20 in which multilayered wiring layers are formed. Further, the fixed layer 1 serving as the first electrode is formed on the uppermost metal wiring layer in addition to ordinary wiring patterns including the wiring patterns 4 and 7. The fixed electrode 1 is formed in the uppermost metal wiring layer in the semiconductor substrate 30. The film thickness of the fixed electrode 1 is 0.5 μm. The fixed electrode 1 is shaped like a square, whose one side has a length of 100 μm in plan view, and is made of aluminum.

Incidentally, although omitted in the present embodiment, the circuit element 15 and the metal wiring layer 20 of the semiconductor substrate 30 prepared in the first step can be formed in a wafer process that is the same as the process including the following steps according to the seventh embodiment.

Figure 9B:
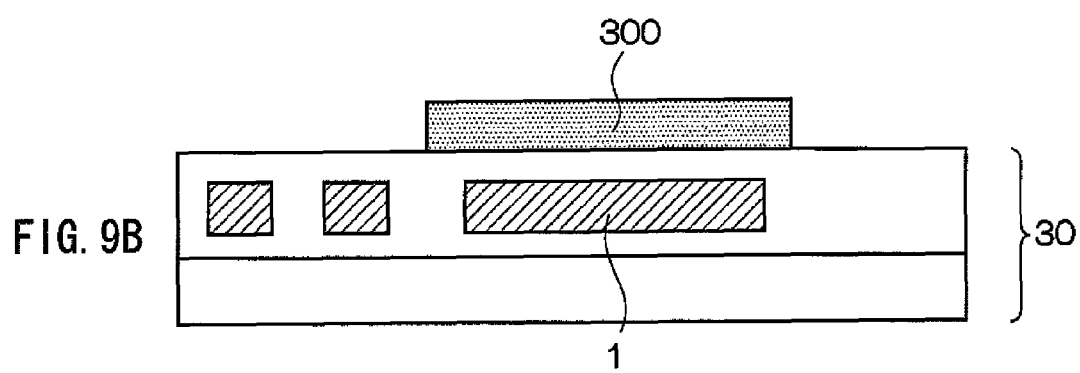

Next, the step of forming the first sacrificing film 300 as the first deposition film on the semiconductor substrate 30 is described below with reference to FIG. 9B. First, a silicon nitride film having a film thickness of 0.5 μm is deposited on the semiconductor substrate 30 using a plasma chemical vapor deposition (CVD) method. Next, the patterning of the silicon nitride film is performed by a photolithography method and dry-etching to form the first sacrificing film 300. The first sacrificing film 300 is formed to cover the fixed electrode 1 and is shaped like a square, whose one side has a length of 100 μm in plan view, as illustrated in FIG. 9B.

Figure 9C:
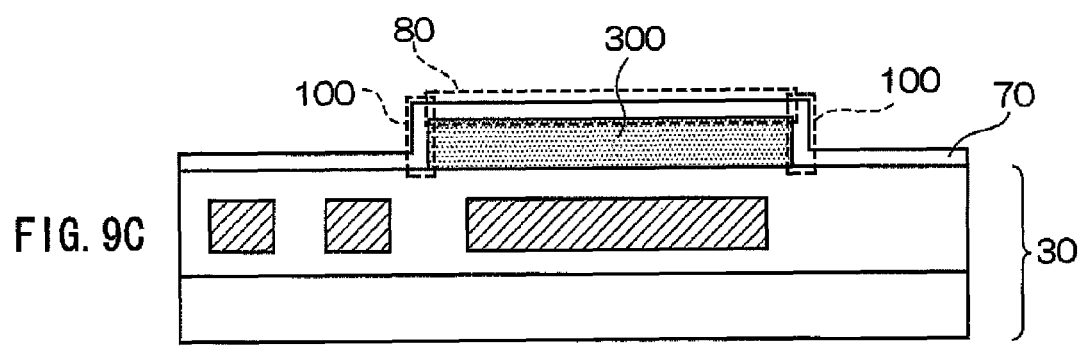

Next, the step of coating the first sacrificing film 300 serving as the first deposition film with the first insulating film 70 is described with reference to FIG. 9C. The first insulating film 70 is deposited on the semiconductor substrate 30 and the first sacrificing film 300 by the plasma CVD method to have a film thickness of 0.5 μm. The material of the first insulating film 70 is a silicon oxide film. Incidentally, for the convenience of description, in the following description, the first insulating film 70 on the first sacrificing film 300 is assumed to be the movable plate 80. The first insulating film 70 provided in a direction perpendicular to the surface o the semiconductor substrate 30 is assumed to be a fixed portion 100.

Figure 9D:
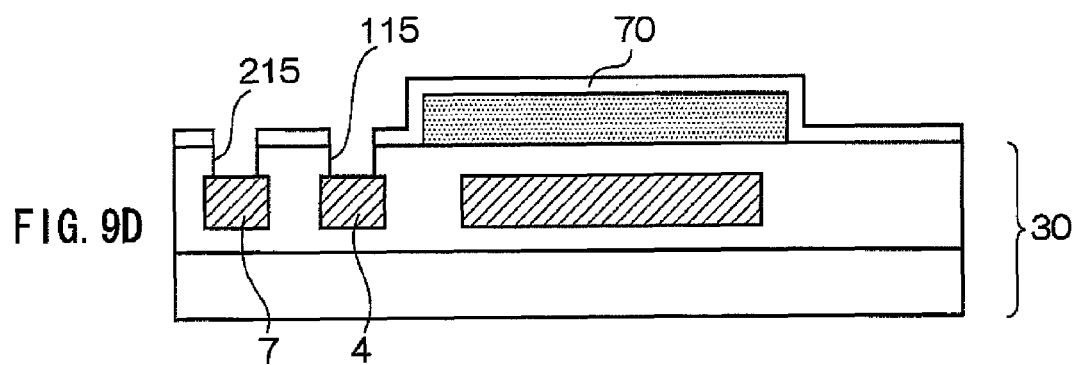

Next, the step of forming the through holes 115 and 215 is described below with reference to FIG. 9D. The through holes 115 and 215 are simultaneously formed by penetrating the first insulating film 70 and a part of the semiconductor substrate 30 and by exposing the wiring patterns 4 and 7 by dry-etching. The through hole 115 is used to expose the wiring pattern 4. The through hole 215 is used to expose the wiring pattern 7.

Figure 9E:
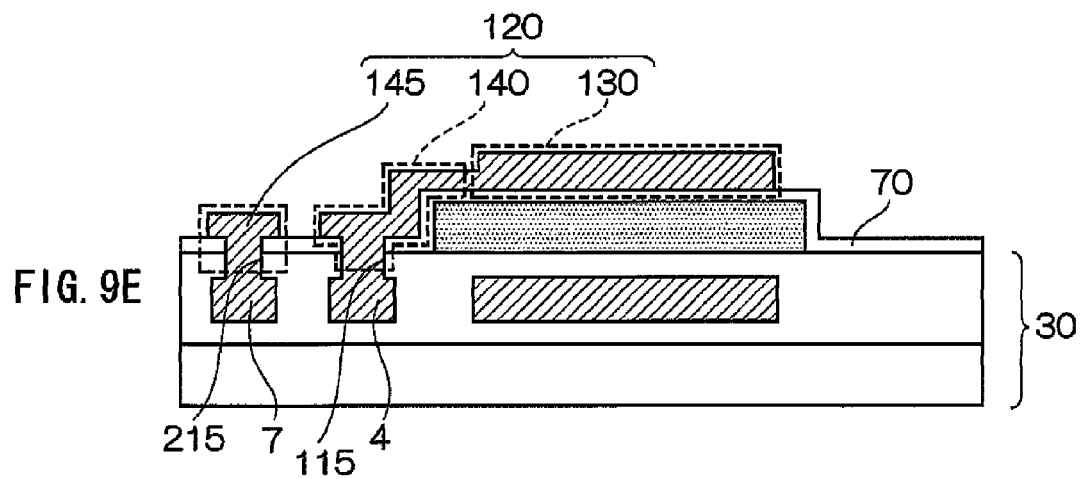

Next, the step of forming the movable electrode 130 serving as the second electrode on the first insulating film 70 provided on the sacrificing film 300 is described with reference to FIG. 9E. Further, in this step, wiring patterns 140 and 145 are also simultaneously formed. Incidentally, the movable electrode 130, and the wiring patterns 140 and 145 are formed by the patterning of a electrically conductive film 120.

First, the electrically conductive film 120 is deposited using a sputtering method, so that the film thickens of the electrically conductive film 120 is 3 µm. The reason for using the sputtering method is that the cost of the sputtering method is lower than that of the CVD method. Further, a temperature, at which this film is formed, is set to be 400° C. or lower. In a case where the sensor according to the present embodiment is used as an acceleration sensor, the material of the electrically conductive film 120 is tungsten (W). In a case where the sensor according to the present embodiment is used as a magnetic sensor, the material of the electrically conductive film 120 is nickel (Ni). Next, the movable electrode 130, and a wiring pattern 140 and 145 are formed by the photolithography method and dry-etching.

Figure 10:
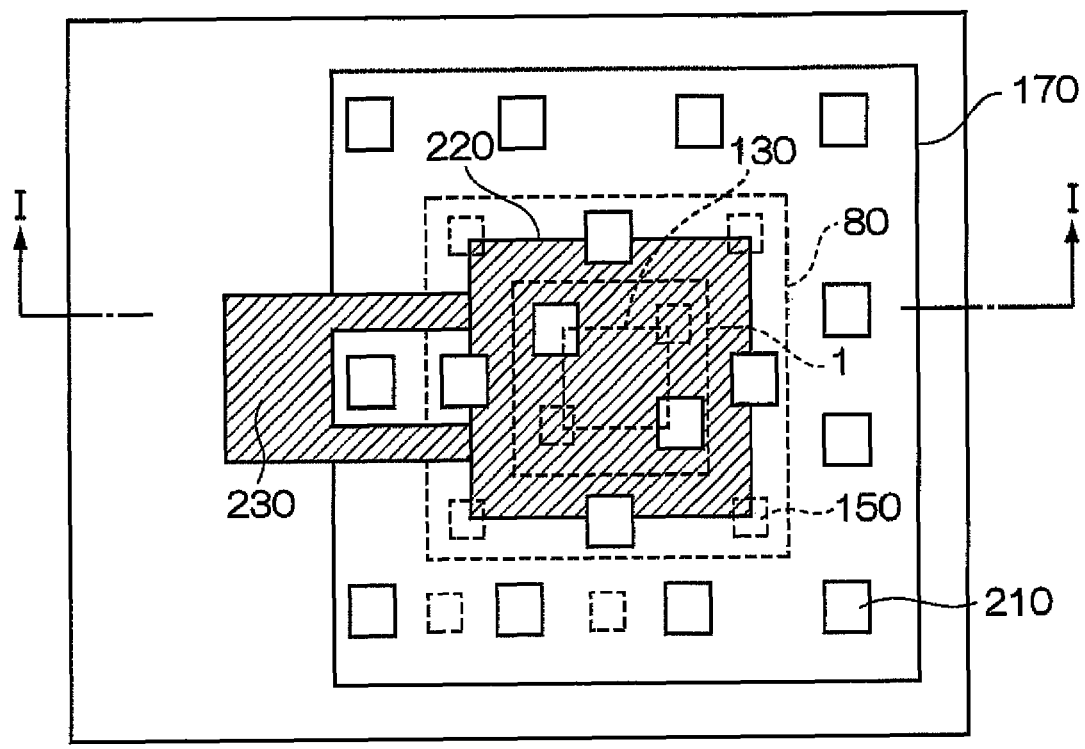
FIG. 10 is a plan view illustrating a manufacturing method according to the invention.

The movable electrode 130 is shaped like a square, whose one side has a length of 30 µm, to overlap with the fixed electrode 1 in plan view, as illustrated in FIG. 10. The wiring pattern 140 extends over the insulating film 70 and is connected to the wiring pattern 4, which is exposed by the through hole 115, via the through hole 115 at one end thereof. The wiring pattern 140 is connected to the movable electrode 130 at the other end thereof. The wiring pattern 145 is connected to the wiring pattern 7 by filling the through hole 315.

Figure 9F:
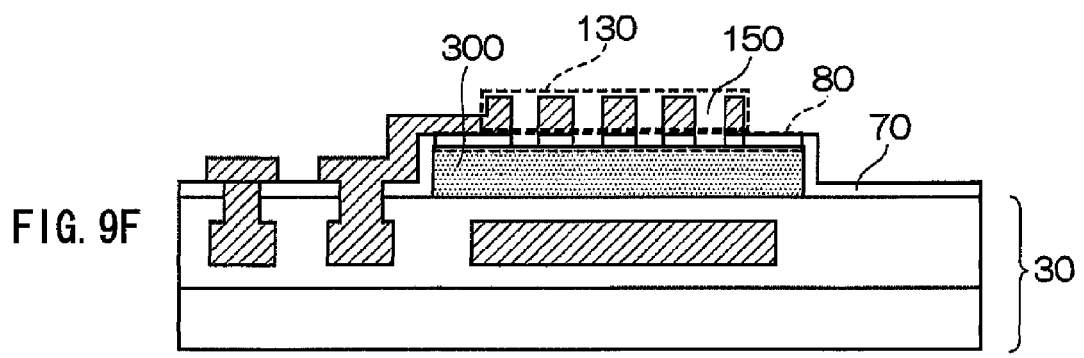

Next, the step of forming the through hole 150 serving as a first opening portion, which penetrates the movable electrode 130 and the first insulating film 70 or the first insulating film 70 to thereby expose a part of the first sacrificing film 300 is described with reference to FIG. 9F. The through hole 150 is formed by the photolithography method or dry-etching to penetrate the movable electrode 130 and the movable plate 80 on the first insulating film or to penetrate the movable plate 80 on the first insulating film and expose a part of the surface of the first sacrificing film 300.

Incidentally, the movable electrode 130, the movable plate 80, and the fixed portion 100, which are formed by the aforementioned steps, are generically referred to as the structure 135. This structure 135 is in agreement with the structure 135 of the common structure according to the embodiments of the invention.

Figure 9G:
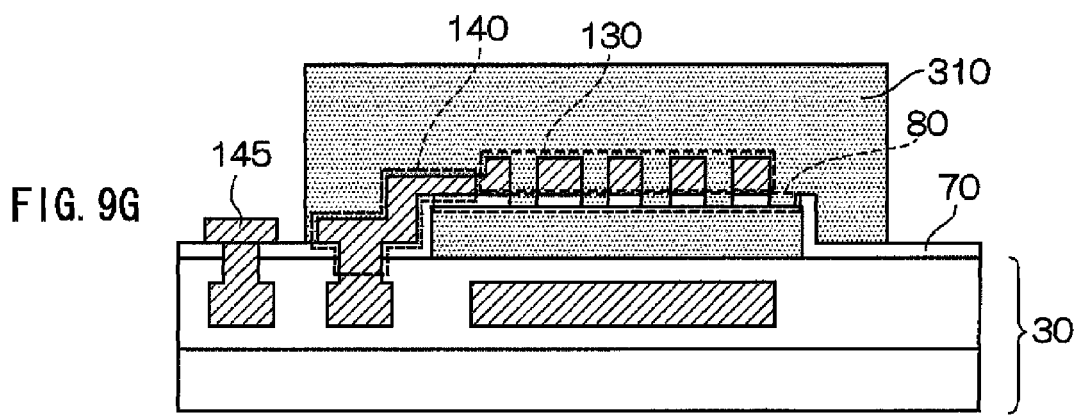

Next, the step of coating the movable electrode 130 and the movable plate 80 with the second sacrificing film 310 serving as the second deposition film is described with reference to FIG. 9G. First, a silicon nitride film having a film thickness of 0.5 µm is deposited using the plasma CVD method on the movable electrode 130, the wiring pattern 140, and the first insulating film 70 formed on the semiconductor substrate 30. Then, the second sacrificing film 310 is formed by the photolithography method or by dry-etching.

The second sacrificing film 310 can be formed so as to coat the movable electrode 130, the wiring pattern 140 and the vibrating plate 80, to expose the wiring pattern 145, and to cover the fixed portion 100. Incidentally, the second sacrificing film 310 is shaped like a square, whose one side has a length of 100 µm, in plan view.

Figure 9H:
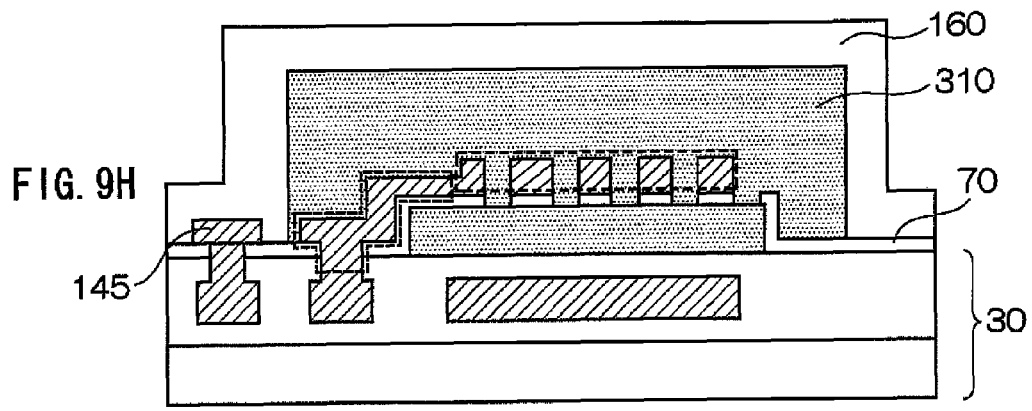

Next, the step of coating the second sacrificing film 310 with the sealing member 160 serving as the second insulating film is described with reference to FIG. 9H. The sealing member 160 is formed by depositing a silicon oxide film having a film thickness of 1 µm on the wiring pattern 145, the first insulating film 70, and the sacrificing film 310, using the plasma CVD method.

Figure 9I:
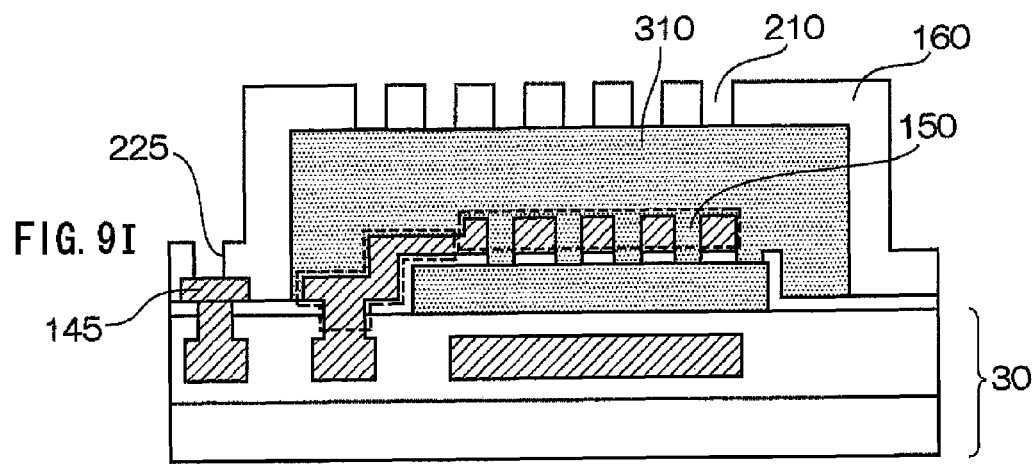

Next, the step of forming the through hole 210 serving as the second opening portion, which exposes a part of the second sacrificing film by penetrating the sealing member 160 on the second sacrificing film 310, is described with reference to FIG. 9I. At that time, a through hole 225 is also simultaneously formed.

The through hole 210 is formed by penetrating a part of the sealing member 160 formed in plan view on the movable electrode 220 and the second sacrificing film 310 by the photolithography method and by dry-etching. At that time, a part of the surface of the second sacrificing film 310 is exposed via one or more of the through holes formed at one place or at plural places. Incidentally, preferably, the through holes 210 are formed at places, at which the through holes 210 do not overlap with the through holes 150 in plan view, as illustrated in FIG. 9I. Further, the through holes 225 are formed simultaneously with the through holes 210 by the photolithography method and dry-etching to expose the wiring pattern 145.

Figure 9J:
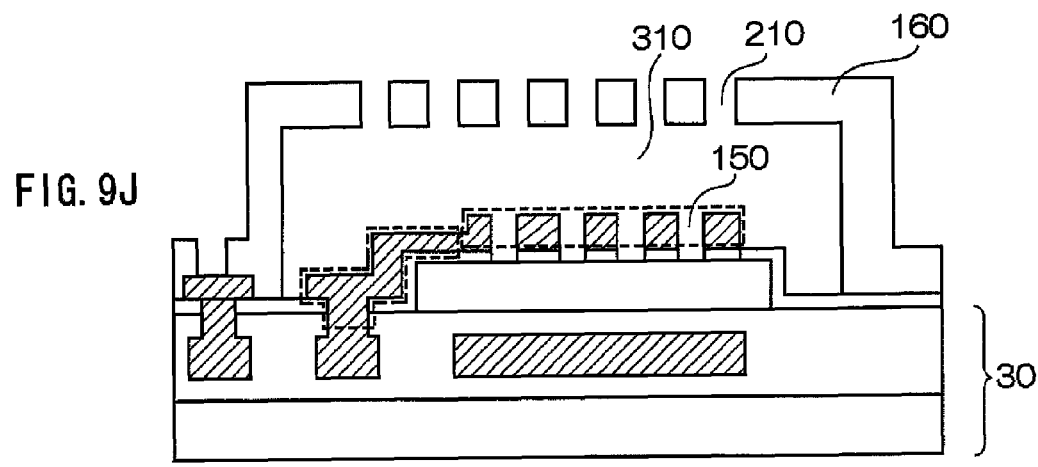

Next, the step of removing the first sacrificing film 300 and the second sacrificing film 310 through the through holes 150 and 210 is described with reference to FIG. 9J. The first sacrificing film 300 and the second sacrificing film 310 are removed by wet-etching using thermal phosphoric acid filtration at a temperature from 120° C. to 160° C. Thus, the first sacrificing film 300 and the second sacrificing film 310, which cannot be removed through the through holes 150 and 210 in the case of employing dry-etching, can be removed by employing wet-etching.

Further, the silicon nitride film used in the first sacrificing film 300 and the second sacrificing film 310 can be differentiated from other peripheral members formed of silicon oxide films and can selectively be removed therefrom by using a thermal phosphoric acid at a temperature from 120° C. to 160° C. Incidentally, in a case where each of the first sacrificing film 300 and the second sacrificing film 310 is formed of a silicon oxide film, each of the sealing member 160 and the first insulating film 70 of a silicon nitride film is formed of a silicon nitride film. Consequently, similarly, the silicon nitride film can be removed.

Incidentally, a hollow space obtained by removing the first sacrificing film 300 is the hollow portion 110 in the embodiment of the structure. A hollow space obtained by removing the second sacrificing film 310 is the hollow portion 200 in the embodiment of the structure.

Figure 9K:
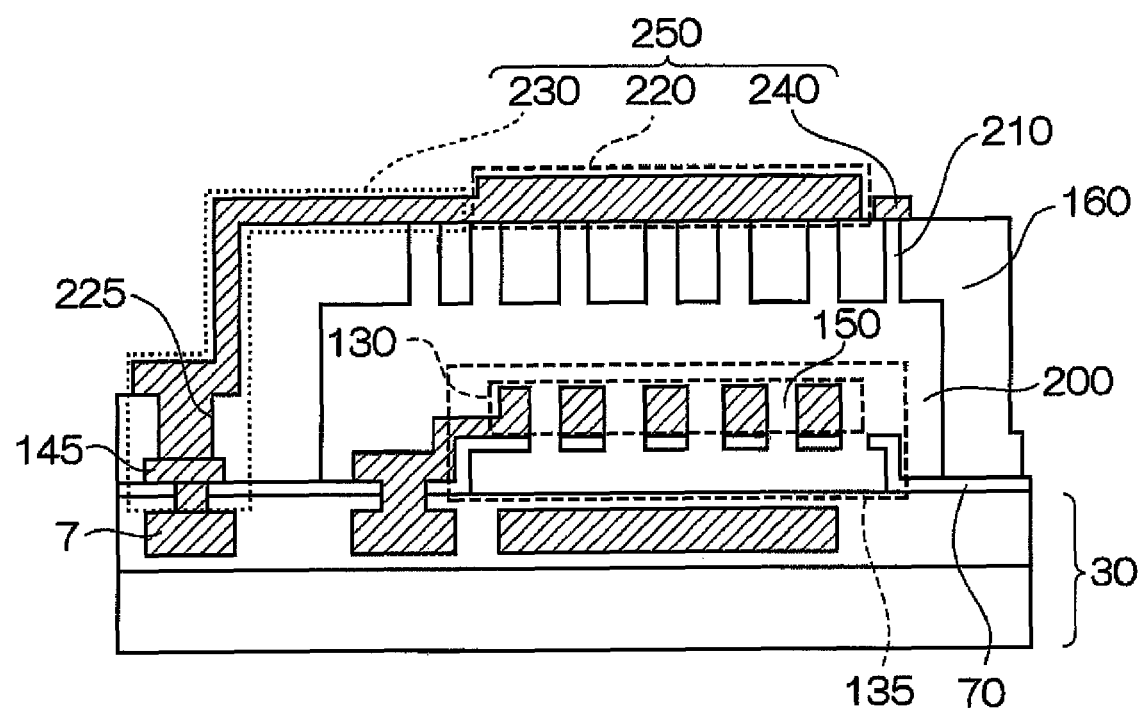

Next, the step of forming the movable electrode 220 serving as a third electrode by blocking up the through holes 210 is described with reference to FIG. 9K. At that time, the wiring pattern 230 and the sealing member 240 are simultaneously formed. Incidentally, the movable electrode 220, the wiring pattern 230, and the sealing pattern 240 are formed by performing the patterning of a deposition film 250.

First, the through holes 210 are blocked up by depositing the deposition film 250 having a film thickness of 1 µm on the sealing member 160. Preferably, the deposition film 250 is deposited using a sputtering method. Incidentally, the deposition film 250 can be formed using, e.g., a CVD method. However, in this case, there is a fear that according to the characteristics of the CVD method, the material of the deposition film 250 coats the entire movable electrode 130 and blocks up the through holes 150. Thus, preferably, the deposition film 250 is deposited using the sputtering method. Due to the linearity of the sputtering method, the use of the sputtering method prevents the movable electrode 130 from being coated with the material of the deposition film. In view of the fact that no through hole is formed under the through hole 210, the use of the sputtering method eliminates a problem due to the CVD method, i.e., a problem in that the material of the deposition film blocks up the through hole 150.

Hereinafter, the step of forming the deposition film 250 using the sputtering method is described. First, the deposition film is placed in a chamber. Then, the internal air pressure of the chamber is set at 15 Pa. More preferably, the internal air pressure of the chamber is equal to or lower than 0.2 Pa. Second, the through hole 210 is blocked up by depositing the deposition film 250 on the sealing member 160 using the sputtering method. Incidentally, preferably, aluminum or a material including aluminum as a main ingredient is used. More specifically, the deposition film 250 formed in the vicinity of the through hole 210 grows towards the center of the through hole 210. Thus, the through hole 210 is gradually blocked. Finally, the through hole 210 is completely blocked up.

Incidentally, it is preferable from a viewpoint of reducing a time required to block up the through hole 210 that when the through hole 210 is blocked, the temperature of the semiconductor substrate 30 is set to be as high as possible. This is because of the fact that as the temperature rises, time taken by the material, whose main ingredient is aluminum, deposited on the sealing member 160 in the vicinity of the through hole 210 to reach the center of the through hole 210 is gradually reduced. However, when the temperature exceeds 400° C., variation in the aluminum wiring formed in the metal wiring layer 20 occurs. Thus, the possibility of occurrence of migration becomes high. In consideration of this, preferably, the temperature of the semiconductor substrate 30 at the formation of the film ranges from 300° C. to 400° C. The optimal temperature is 345° C.

Next, the movable electrode 220, the wiring pattern 230, and the sealing pattern 240 are formed by the patterning of the deposition film 250 through the photolithography method and dry-etching. The movable electrode 220 is shaped like a square, whose one side has a length of 100 μm, in plan view. The movable electrode 220 is formed to cover the movable electrode 130 in plan view, as illustrated in FIG. 13. The wiring pattern 230 extends over the sealing film 160. The wiring pattern 230 is connected to the movable electrode 220 at one end thereof and is connected to a wiring pattern 145 at the other end thereof by filling the through hole 225. The sealing pattern 240 seals the through holes 210 other than the through hole 210 sealed by the movable electrode 220. Although the deposition film 250 blocks all the through holes 210, the sealing pattern is effective in reducing the weight of the entire sensor by the movable electrode 220, the wiring pattern 230, and the sealing pattern 240 to remain in the deposition film, and by removing the remaining parts of the deposition film 250.

Incidentally, in the present embodiment, preferably, each of the steps subsequent to the step of forming the metal wiring layer 20 is performed at a temperature equal to or lower than 400° C. This is because aluminum used in the metal wiring layer 20 causes migration at a temperature higher than 400° C. to thereby degrade the reliability of the wiring. Thus, according to the present embodiment, the plasma CVD method is used when the sacrificing film 300, the insulating film 70, the sacrificing film 310 and the sealing film 160 are formed. Accordingly, each of all steps subsequent to the formation of the metal wiring layer 20 can be perform at a temperature equal to or lower than 400° C.

Thus, the common structure of sensors according to the embodiments of the invention can be formed.

The advantages of the seventh embodiment of the invention described in the foregoing description are as follows.

First, according to the present embodiment, the structure of the sensor according to the invention can be implemented.

Second, the sealing member can be prevented by using the sputtering method in the tenth step to thereby form the movable electrode 220 from causing a problem in that the sealing member is closely attached to and covering the structure 135 when the space containing the structure 135 serving as the MEMS is sealed. Consequently, the structure 135 can implement a desired operation and can obtain desired advantages.

Third, the process from the formation of the structure 135 serving as the MEMS to the sealing of the structure 135 with the sealing member 160 can be performed in the same wafer process. Thus, a packaging step is unnecessary. Consequently, the manufacturing cost of the sensor can be reduced.

Fourth, the hollow portions 110 and 200 can easily be sealed by using the sputtering method so that the internal pressure of each of the hollow portions 100 and 200 is maintained at 15 Pa or lower. Thus, the present embodiment can obtain advantages due to the fact that the inside of each of the hollow portions 110 and 200 of the acceleration sensor is vacuum.

Fifth, the through hole 210 can be blocked up, without blocking up the through hole 150, by forming the through holes 150 and 210 so that the through hole 150 does not overlap with the through hole 210 in plan view. Consequently, the present embodiment can obtain advantages due to that the acceleration sensor according to the invention has the through hole 150.

What is claimed is:

1. A sensor comprising:
    a semiconductor substrate;
    a first electrode on a surface of or within the semiconductor substrate;
    a structure on the semiconductor substrate, the structure including a vibratable second electrode that is spaced from and opposed to the semiconductor substrate and the first electrode;
    a first sealing member on the semiconductor substrate spaced from the structure and covering the structure, and which includes a first through hole there through;
    a vibratable third electrode on the first sealing member blocking the first through hole, the vibratable third electrode spaced from and opposed to the vibratable second electrode;
    wherein the vibratable third electrode is aligned over the vibratable second electrode and the vibratable second electrode is aligned over the first electrode;
    a first detecting portion that measures a change of capacitance between the vibratable second electrode and the first electrode to detect an acceleration;
    a second detecting portion that measures a change of capacitance between the vibratable third electrode and the vibratable second electrode to detect a pressure; and
    wherein a member of the third electrode is attached only to a region of the first sealing member directly over the first through hole, on a surface of the first sealing member which is opposite to the semiconductor substrate.

2. The sensor according to claim 1, wherein the first sealing member is one of a silicon oxide film or a silicon nitride film.

3. The sensor according to claim 1, wherein one of a circuit element or a metal wiring layer is formed below the first sealing member and within the semiconductor substrate.

4. The sensor according to claim 1, wherein a circuit element and a metal wiring layer are formed below the first sealing member.

5. The sensor according to claim 1, wherein the structure overlaps with a part of the surface of the semiconductor substrate and is spaced from the semiconductor substrate, and wherein the second electrode is formed above the part of the surface of the semiconductor substrate.

6. The sensor according to claim 5, wherein the structure includes a second through hole.

7. The sensor according to claim 6, wherein air pressure of a hollow space housed by the first sealing member and the semiconductor substrate is equal to or less than 15 Pa.

8. The sensor according to claim 1, wherein the second electrode is directly over and has a smaller surface area than the first electrode.

9. The sensor according to claim 8, wherein the third electrode is directly over and has a larger surface area than the second electrode.

10. The sensor according to claim 1, wherein a most abundant component of the second electrode is an electrically conductive material having a density equal to or higher than 10 g/cm$^3$.

11. The sensor according to claim 10, wherein the most abundant component of the second electrode is one of tungsten, tantalum, hafnium, iridium, platinum, or gold.

12. The sensor according to claim 11, wherein a most abundant component of the first electrode is one of nickel, iron, or cobalt.

13. The sensor according to claim 12, wherein a most abundant component of the third electrode is aluminum.

14. The sensor according to claim 1, wherein a most abundant component of the second electrode is a ferromagnetic substance.

15. The sensor according to claim 1, wherein the third electrode is grounded.

* * * * *